(12) United States Patent
Hayashi et al.

(10) Patent No.: US 10,622,563 B2
(45) Date of Patent: Apr. 14, 2020

(54) SEMICONDUCTOR DEVICE, SOLID-STATE IMAGING DEVICE, ELECTRONIC APPARATUS, AND MANUFACTURING METHOD OF SEMICONDUCTOR DEVICE

(71) Applicant: SONY SEMICONDUCTOR SOLUTIONS CORPORATION, Kanagawa (JP)

(72) Inventors: Toshihiko Hayashi, Kanagawa (JP); Takayoshi Honda, Kanagawa (JP); Yuji Uesugi, Kanagawa (JP); Katsunori Hiramatsu, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/572,858

(22) PCT Filed: May 6, 2016

(86) PCT No.: PCT/JP2016/063622
§ 371 (c)(1),
(2) Date: Nov. 9, 2017

(87) PCT Pub. No.: WO2016/185914
PCT Pub. Date: Nov. 24, 2016

(65) Prior Publication Data
US 2018/0114909 A1    Apr. 26, 2018

(30) Foreign Application Priority Data

May 19, 2015  (JP) .................................. 2015-101574
Jul. 3, 2015  (JP) .................................. 2015-134485

(51) Int. Cl.
*H01L 51/00* (2006.01)
*H01L 27/146* (2006.01)
(Continued)

(52) U.S. Cl.
CPC .... *H01L 51/0015* (2013.01); *H01L 27/14647* (2013.01); *H01L 27/14665* (2013.01);
(Continued)

(58) Field of Classification Search
None
See application file for complete search history.

(56) References Cited

U.S. PATENT DOCUMENTS 8,933,527 B2   1/2015   Chu et al.
2009/0322923 A1   12/2009   Maehara
(Continued)

FOREIGN PATENT DOCUMENTS

CN   101997014 A   3/2011
CN   103579381 A   2/2014
(Continued)

OTHER PUBLICATIONS

International Search Report and Written Opinion of PCT Application No. PCT/JP2016/063622, dated Jun. 14, 2016, 10 pages of ISRWO.

*Primary Examiner* — Benjamin P Sandvik
(74) *Attorney, Agent, or Firm* — Chip Law Group

(57) ABSTRACT

The present technology relates to a semiconductor device, a solid-state imaging device, an electronic apparatus, and a manufacturing method of the semiconductor device which can suppress generation of residual carriers within an organic film. The semiconductor device includes: a first electrode; a second electrode; and an organic film that is disposed between the first electrode and the second electrode. At least one of the first electrode and the second electrode is discontinuous. The organic film includes an inter-electrode region, which is a region interposed between the first electrode and the second electrode, and a non-inter-electrode region, which is a region not interposed between
(Continued)

the first electrode and the second electrode, and the non-inter-electrode region is disposed between the adjacent inter-electrode regions. A suppression region, which is a region in which at least one of generation and movement of a carrier is suppressed, is present within the non-inter-electrode region.

19 Claims, 19 Drawing Sheets

(51) Int. Cl.
      *H01L 51/42*       (2006.01)
      *H01L 27/30*       (2006.01)
      *H01L 27/32*       (2006.01)
      *H01L 51/50*       (2006.01)

(52) U.S. Cl.
    CPC ........ *H01L 27/307* (2013.01); *H01L 27/3246* (2013.01); *H01L 51/0018* (2013.01); *H01L 51/0026* (2013.01); *H01L 51/42* (2013.01); *H01L 51/5012* (2013.01); *Y02P 70/521* (2015.11)

(56) References Cited

U.S. PATENT DOCUMENTS

| | | | |
|---|---|---|---|
| 2010/0060769 A1 | 3/2010 | Inuiya | |
| 2011/0032376 A1 | 2/2011 | Takizama | |
| 2013/0099659 A1* | 4/2013 | Park | H01L 51/5012 313/504 |
| 2014/0347538 A1* | 11/2014 | Toda | H01L 27/14603 348/308 |
| 2015/0069361 A1 | 3/2015 | Sato et al. | |
| 2015/0118787 A1 | 4/2015 | Chu et al. | |
| 2015/0179845 A1* | 6/2015 | Toda | H01L 27/14649 348/164 |
| 2016/0013255 A1* | 1/2016 | Sato | H01L 27/3246 257/40 |
| 2016/0380035 A1* | 12/2016 | Cho | H01L 27/3246 257/40 |

FOREIGN PATENT DOCUMENTS

| | | | | |
|---|---|---|---|---|
| JP | 2010-010478 A | 1/2010 | | |
| JP | 2010-067827 A | 3/2010 | | |
| JP | 2011-040518 A | 2/2011 | | |
| JP | 2011-100894 A | 5/2011 | | |
| JP | 2014-053120 A | 3/2014 | | |
| JP | 2015-053214 A | 3/2015 | | |
| JP | 2016018759 A | * 2/2016 | ......... H01L 27/3246 |
| KR | 10-2011-0016393 A | 2/2011 | | |
| KR | 10-2014-0016799 A | 2/2014 | | |
| KR | 10-2015-0029556 A | 3/2015 | | |
| TW | 201114023 A | 4/2011 | | |
| TW | 201405790 A | 2/2014 | | |
| TW | 201511239 A | 3/2015 | | |

* cited by examiner

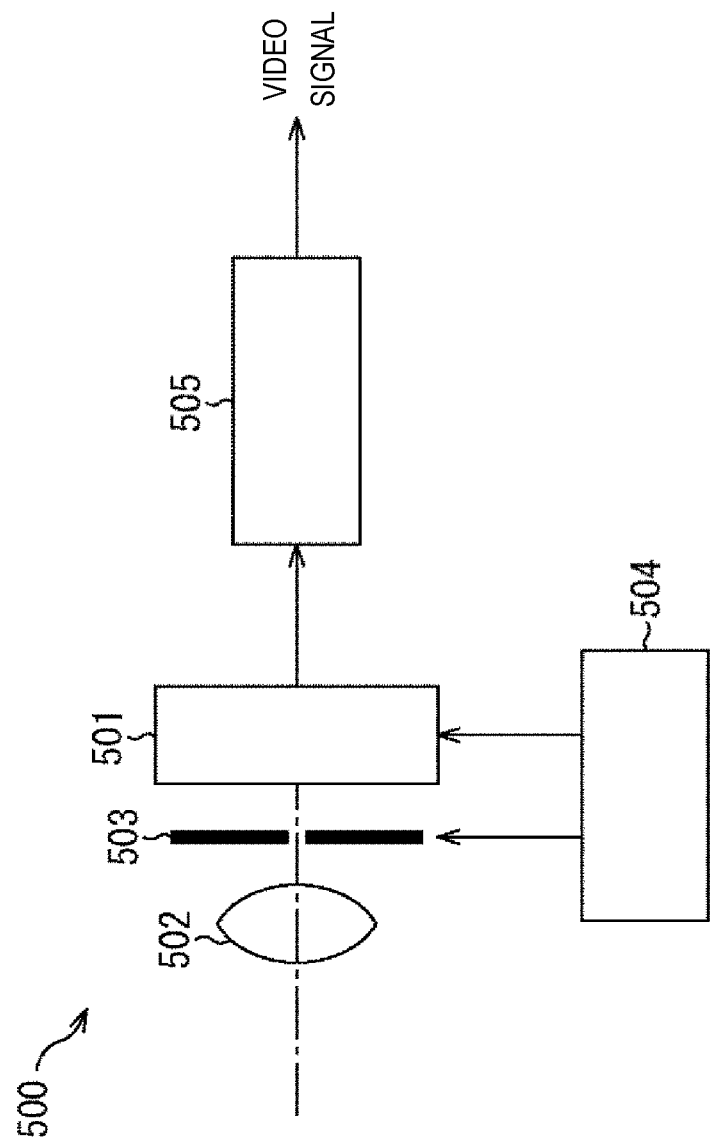

SEMICONDUCTOR DEVICE, SOLID-STATE IMAGING DEVICE, ELECTRONIC APPARATUS, AND MANUFACTURING METHOD OF SEMICONDUCTOR DEVICE

CROSS REFERENCE TO RELATED APPLICATIONS

This application is a U.S. National Phase of International Patent Application No. PCT/JP2016/063622 filed on May 6, 2016, which claims priority benefit of Japanese Patent Application No. JP 2015-101574 filed in the Japan Patent Office on May 19, 2015 and also claims priority benefit of Japanese Patent Application No. JP 2015-134485 filed in the Japan Patent Office on Jul. 3, 2015. Each of the above-referenced applications is hereby incorporated herein by reference in its entirety.

TECHNICAL FIELD

The present technology relates to a semiconductor device, a solid-state imaging device, an electronic apparatus, and a manufacturing method of the semiconductor device, and particularly to a semiconductor device, a solid-state imaging device, an electronic apparatus, and a manufacturing method of the semiconductor device which can suppress generation of residual carriers within an organic film.

BACKGROUND ART

Development of solid-state imaging devices having organic photoelectric conversion layers as light receiving layers that are formed using organic films has advanced in recent years.

However, characteristics of the organic photoelectric conversion layers easily deteriorate due to exposure to air or isolation processing. For this reason, there are many cases in which a configuration in which a lower electrode film is separated with respect to each pixel and an organic photoelectric conversion layer and an upper electrode film are shared between pixels without being separated is employed (e.g., see Patent Literature 1).

CITATION LIST

Patent Literature

Patent Literature 1: JP 2013-93353A

DISCLOSURE OF INVENTION

Technical Problem

However, in the case in which the organic photoelectric conversion layer and the upper electrode film are shared between the pixels, field intensity is weakened in a region between adjacent pixels in which no lower electrode is provided and reading of carriers that are generated during light irradiation is delayed. As a result, residual carriers are generated and an afterimage may occur over a plurality of frames due to the residual carriers.

The present technology takes into account the above-described circumstance, and aims to suppress generation of residual carriers within an organic film.

Solution to Problem

According to a first aspect of the present technology, a semiconductor device includes: a first electrode; a second electrode; and an organic film that is disposed between the first electrode and the second electrode. At least one of the first electrode and the second electrode is discontinuous. The organic film includes an inter-electrode region, which is a region interposed between the first electrode and the second electrode, and a non-inter-electrode region, which is a region not interposed between the first electrode and the second electrode, and the non-inter-electrode region is disposed between the adjacent inter-electrode regions. A suppression region, which is a region in which at least one of generation and movement of a carrier is suppressed, is present within the non-inter-electrode region.

The suppression region may have a different electrical characteristic from a surrounding region of the suppression region within the organic film.

The suppression region may have a difference in at least one of carrier concentration, degree of movement, and band configuration from the surrounding region.

The suppression region may have a difference in at least one of integration state, crystalline orientation, and composition from the surrounding region.

The suppression region may be formed to be parallel with an end of the inter-electrode region and reaches from one surface to the other surface of the organic film.

A hollow groove may be formed in the suppression region to be parallel with an end of the inter-electrode region.

The hollow groove may pass through the organic film.

The suppression region may extend from the non-inter-electrode region on at least one surface of the organic film.

The first electrode may be continuous and the second electrode is discontinuous. Electric resistance of a high resistance region, which is all or a part of a portion of the first electrode facing a discontinuous portion of the second electrode, may be higher than surroundings.

The high resistance region may have a difference in at least one of integration state, composition, and thickness from a surrounding region of the first electrode.

The suppression region may be present in a region facing the high resistance region in the organic film.

The first electrode may be an electrode on a side on which incidence light is incident on the organic film.

The organic film may be used as an organic photoelectric conversion film.

The organic film may be used as an organic EL film.

According to a second aspect of the present technology, a solid-state imaging device includes: a first electrode; a second electrode; and an organic photoelectric conversion film that is disposed between the first electrode and the second electrode. At least one of the first electrode and the second electrode is discontinuous between pixels. A suppression region, which is a region in which at least one of generation and movement of a carrier is suppressed, is present within an inter-pixel region, which is a region between adjacent pixels within the organic photoelectric conversion film.

According to a third aspect of the present disclosure, an electronic apparatus includes: a semiconductor device; and a signal processing unit configured to process a signal output from the semiconductor device. The semiconductor device includes a first electrode; a second electrode; and an organic film that is disposed between the first electrode and the second electrode. At least one of the first electrode and the second electrode is discontinuous. The organic film includes an inter-electrode region, which is a region interposed between the first electrode and the second electrode, and a non-inter-electrode region, which is a region not interposed between the first electrode and the second electrode, and the non-inter-electrode region is disposed between the adjacent inter-electrode regions. A suppression region, which is a region in which at least one of generation and movement of a carrier is suppressed, is present within the non-inter-electrode region.

According to a fourth aspect of the present technology, a manufacturing method of a semiconductor device includes a first electrode, a second electrode, and an organic film that is disposed between the first electrode and the second electrode, in which at least one of the first electrode and the second electrode is discontinuous, and the organic film includes an inter-electrode region, which is a region interposed between the first electrode and the second electrode, and a non-inter-electrode region, which is a region not interposed between the first electrode and the second electrode, and the non-inter-electrode region is disposed between adjacent inter-electrode regions. A suppression region, which is a region in which at least one of generation and movement of a carrier is suppressed, is formed within the non-inter-electrode region by radiating ultraviolet light or implanting ions into the non-inter-electrode region.

According to a fifth aspect of the present technology, a manufacturing method of a semiconductor device includes a first electrode, a second electrode, and an organic film that is disposed between the first electrode and the second electrode, in which the first electrode is continuous and the second electrode is discontinuous, and the organic film includes an inter-electrode region, which is a region interposed between the first electrode and the second electrode, and a non-inter-electrode region, which is a region not interposed between the first electrode and the second electrode, and the non-inter-electrode region is disposed between the adjacent inter-electrode regions. A high resistance region having higher electric resistance than surroundings is formed by performing plasma processing, ultraviolet light irradiation, ion implantation, or thinning on all or a part of a portion of the first electrode facing a discontinuous portion of the second electrode.

According to a first or a third aspect of the present technology, at least one of generation and movement of carriers is suppressed in the non-inter-electrode region, which is a region not interposed between the first electrode and the second electrode in the organic film.

According to a second aspect of the present technology, at least one of generation and movement of carriers is suppressed in the non-inter-electrode region, which is a region not interposed between the first electrode and the second electrode in the organic photoelectric conversion film.

According to a fourth aspect of the present technology, the suppression region, which is a region in which at least one of generation and movement of carriers is suppressed, is formed within the non-inter-electrode region.

According to a fifth aspect of the present technology, the high resistance region having higher electric resistance than a surrounding region is formed over an entirety of or in a part of a portion of the first electrode facing the discontinuous portion of the second electrode.

Advantageous Effects of Invention

According to the first to the fifth aspects of the present technology, generation of residual carriers within the organic film can be suppressed.

Meanwhile, an effect disclosed in this specification is merely an example; an effect of the present technology is not limited to that disclosed in this specification and an additional effect may also be obtained.

BRIEF DESCRIPTION OF DRAWINGS

FIG. 19 is a block diagram illustrating an example of a configuration of an electronic apparatus to which the present technology is applied.

MODE(S) FOR CARRYING OUT THE INVENTION

Exemplary embodiments for implementing the present technology (which will be referred to as embodiments below) will be described below. Note that description will be provided in the following order.
1. First embodiment (example of solid-state imaging device)
2. Second embodiment (example of EL device)
3. Third embodiment (usage example of solid-state imaging device)

4. Fourth embodiment (example of electronic apparatus)
5. Modified examples

1. First Embodiment (Example of Solid-State Imaging Device)

{Example of Schematic Configuration of Solid-State Imaging Device}

Figure 1:
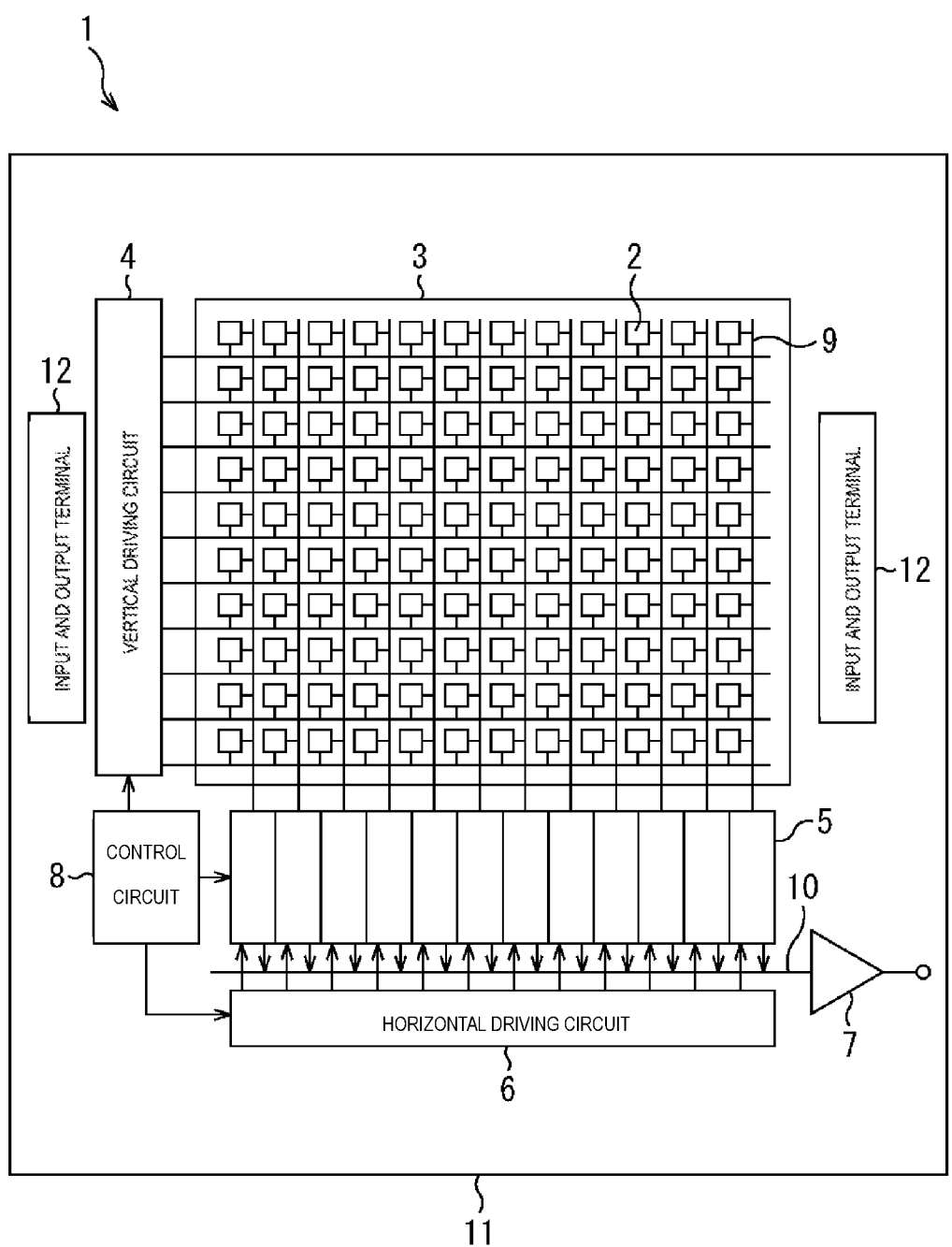
FIG. 1 is a block diagram illustrating an example of a schematic configuration of a solid-state imaging device to which the present technology is applied.

FIG. 1 illustrates an example of a schematic configuration of a complementary metal oxide semiconductor (CMOS) solid-state imaging device which is a first embodiment of the present technology.

As illustrated in FIG. 1, a solid-state imaging device (element chip) 1 includes a pixel region (so-called imaging region) 3 in which a plurality of pixels 2 including photoelectric conversion elements are regularly arrayed 2-dimensionally on a semiconductor substrate 11 (e.g., a silicon substrate) and a surrounding circuit unit.

Each of the pixels 2 includes a photoelectric conversion element (e.g., a photodiode) and a plurality of pixel transistors (so-called MOS transistors). The plurality of pixel transistors can be configured of, for example, three transistors: a transfer transistor, a reset transistor, and an amplification transistor, and can also be configured of four transistors by further including a select transistor. The equivalent circuit of each pixel 2 (unit pixel) is the same as a general equivalent circuit, and thus the detailed description thereof will be omitted herein.

In addition, the pixels 2 may employ a shared pixel structure. The pixel sharing structure is constituted by a plurality of photoelectric conversion elements, a plurality of transfer transistors, one shared floating diffusion, and other pixel transistors which are each shared.

The surrounding circuit unit is configured to include a vertical driving circuit 4, column signal processing circuits 5, a horizontal driving circuit 6, an output circuit 7, and a control circuit 8.

The control circuit 8 receives data instructing an input clock, an operation mode, and the like and outputs data such as internal information of the solid-state imaging device 1. Specifically, the control circuit 8 generates clock signals or control signals serving as operation standards of the vertical driving circuit 4, the column signal processing circuits 5, and the horizontal driving circuit 6 based on a vertical synchronization signal, a horizontal synchronization signal, and a master clock. The control circuit 8 inputs such signals to the vertical driving circuit 4, the column signal processing circuit 5, and the horizontal driving circuit 6.

The vertical driving circuit 4 is configured of, for example, a shift register, selects pixel driving wirings, supplies pulses for driving the pixels 2 to the selected pixel driving wirings, and drives the pixels 2 in units of rows. Specifically, the vertical driving circuit 4 selectively scans the pixels 2 of the pixel region 3 in sequence in the vertical direction in units of rows and supplies the column signal processing circuits 5 with pixel signals Based on signal charges generated according to reception amounts in the photoelectric conversion elements of the pixels 2 via vertical signal lines 9.

The column signal processing circuit 5 is disposed, for example, at each column of the pixels 2 and performs signal processing such as noise removal on signals output from the pixels 2 corresponding to one row for each pixel column. Specifically, the column signal processing circuit 5 performs signal processing such as correlated double sampling (CDS) for removing fixed pattern noise unique to the pixels 2, signal amplification, and analog/digital (A/D) conversion. A horizontal select switch (not illustrated) is connected to a horizontal signal line 10 to be installed at an output end of the column signal processing circuit 5.

The horizontal driving circuit 6 is configured of, for example, a shift register, selects the column signal processing circuits 5 in sequence by outputting the horizontal scanning pulses in sequence, and outputs pixel signals from the column signal processing circuits 5 to the horizontal signal line 10.

The output circuit 7 performs signal processing on signals supplied in sequence from the column signal processing circuits 5 via the horizontal signal line 10 and outputs the signals. For example, the output circuit 7 performs only buffering in some cases and performs black level adjustment, column variation correction, and various kinds of digital signal processing in some cases.

The input and output terminals 12 are installed to exchange signals with the outside.

{Example of Configuration of Solid-State Imaging Device}

Figure 2:
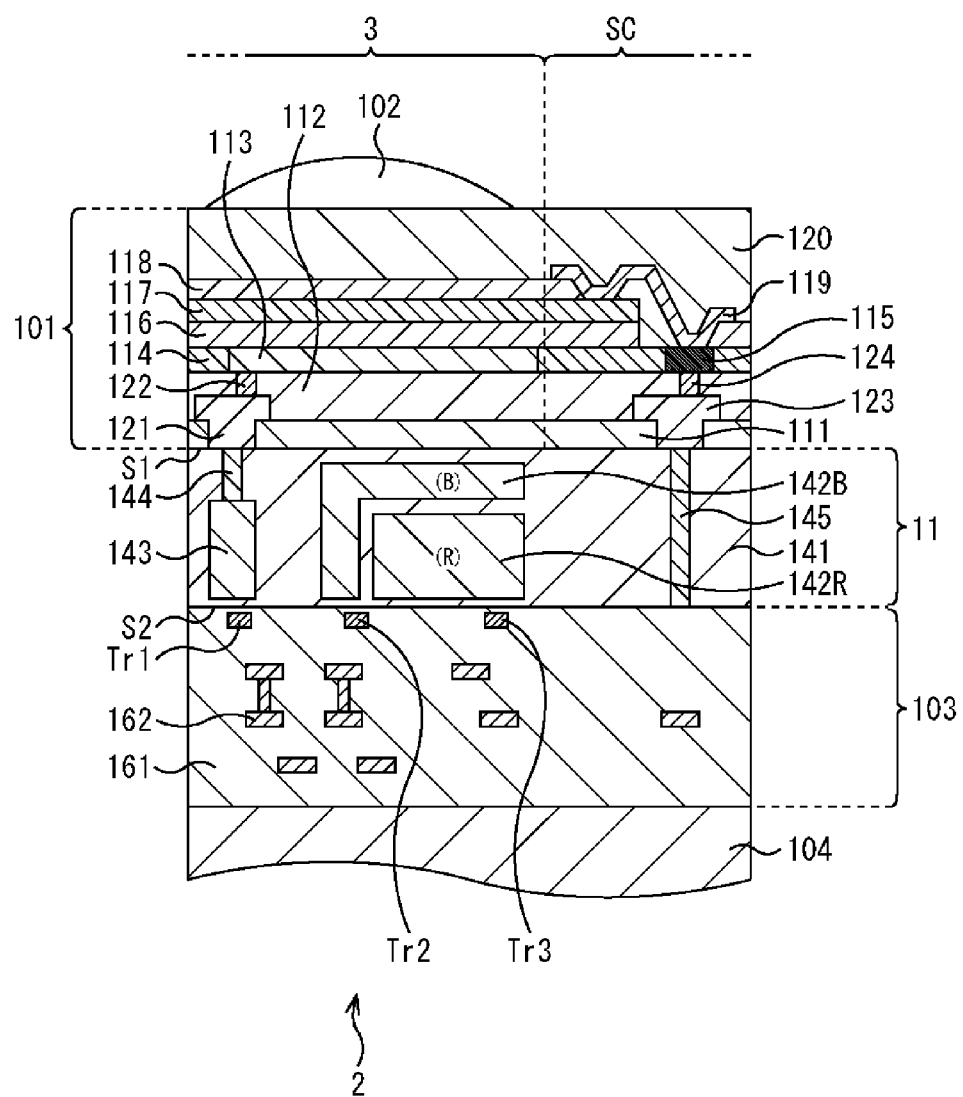
FIG. 2 is a cross-sectional diagram illustrating an example of an overall configuration of the solid-state imaging device.

FIG. 2 is a cross-sectional diagram illustrating an example of an overall configuration of the solid-state imaging device 1. In the example of FIG. 2, a structure corresponding to one around a boundary of the pixel region 3 of the solid-state imaging device 1 of FIG. 1 and a surrounding circuit unit SC thereof is illustrated. For example, the plurality of pixels 2 formed of organic photoelectric conversion elements are formed in the pixel region 3, and surrounding circuits for driving the pixels 2 are formed in the surrounding circuit unit SC.

In addition, the solid-state imaging device 1 has a so-called backside irradiation structure. That is, organic photoelectric conversion units 101 and on-chip lenses 102 (microlenses) are laminated on a backside (a light receiving face S1) of the semiconductor substrate 11 in the solid-state imaging device 1. Furthermore, in the solid-state imaging device 1, a support substrate 104 and a multi-layer wiring layer 103 having a pixel transistor (including a transfer transistor) are laminated on a surface (a face S2 on the opposite side of the light receiving face S1) of the semiconductor substrate 11.

Here, each of the pixels 2 of the pixel region 3 has a structure in which an organic photoelectric conversion unit and inorganic photoelectric conversion units, which selectively detect light having different wavelength bands and perform photoelectric conversion, are vertically laminated. Thus, a plurality of types of color signals can be acquired in each of the pixels without using color filters. Here, each of the pixels 2 has a structure in which one organic photoelectric conversion unit 101 and two inorganic photoelectric conversion units 142B and 142R are laminated, and each of red (R), green (G), and blue (B) color signals is acquired. Specifically, the organic photoelectric conversion unit 101 is formed on the backside (the face S1) of the semiconductor substrate 11, and the inorganic photoelectric conversion units 142B and 142R are embedded inside the semiconductor substrate 11. Configurations of the units will be described below.

The organic photoelectric conversion unit 101 is an organic photoelectric conversion element that absorbs light having a predetermined wavelength band (which is green light here) using an organic semiconductor and generates carriers (electron-hole pairs). The organic photoelectric conversion unit 101 has a configuration in which an organic photoelectric conversion layer 116 is interposed between a pair of electrodes (a lower electrode film 113 and an upper electrode film 117) for acquiring signal charges.

Specifically, an interlayer insulating film 111 and another interlayer insulating film 112 are formed on the face S1 of the semiconductor substrate 11 in the organic photoelectric conversion unit 101.

It is desirable for the interlayer insulating film 111 and the interlayer insulating film 112 to include an insulating film with a low interface state to, for example, lower an interface state with respect to the semiconductor substrate 11 (Si) and suppress occurrence of a dark current from an interface with a silicon layer 141. For example, a laminated film on which a hafnium oxide (HfO2) film and a silicon compound film are sequentially formed from the semiconductor substrate 11 side can be used. As the silicon compound film, for example, a single-layer film formed of any of a silicon oxide (SiO2) film, a silicon nitride (SiN) film, and a silicon oxynitride film (SiON), or a laminated film formed of two or more thereof can be used.

The interlayer insulating film 112 has the lower electrode film 113 formed thereon, and a wiring layer 115 that is electrically isolated from the lower electrode film 113 by the interlayer insulating film 114 formed thereon. In addition, the interlayer insulating film 114 is formed between two adjacent pixels 2 and electrically isolates lower electrode films 113 of the two adjacent pixels 2.

The lower electrode films 113 are provided with respect to each of the pixels to face light receiving faces of the inorganic photoelectric conversion units 142B and 142R formed inside the semiconductor substrate 11 in a region in which the lower electrode films cover the light receiving faces.

Each of the lower electrode films 113 is a transparent metal oxide film and is configured by, for example, a sputtering film containing an oxide. Specifically, the lower electrode film 113 is configured as a conductive film having permeability and is formed of, for example, a metal oxide such as indium tin oxide (ITO). However, in addition to ITO, an indium oxide (In2O3)-based material to which a dopant such as Ti, Zn, Ga, W, or Ce is added, a tin oxide (SnO2)-based material to which a dopant is likewise added, or a zinc oxide-based material (ZnO) to which a dopant is added may be used as constituting materials of the lower electrode film. As zinc oxide-based materials, for example, aluminum zinc oxide (AZO) to which aluminum (Al) is added and gallium zinc oxide (GZO) to which gallium is added as dopants are exemplified. In addition to the above, CuI, InSbO4, ZnMgO, CuInO2, MgIn2O4, CdO, ZnSnO3, and the like may be used.

The interlayer insulating film 114 may be configured by, for example, a single film formed of one of silicon oxide, silicon nitride, silicon oxynitride, aluminum oxide (AlOx), and the like, or a laminated film formed of two or more thereof.

Furthermore, the interlayer insulating film 114 is desirably a film with low water permeability and hygroscopicity to protect the organic photoelectric conversion layer 116 from moisture or the like contained in surrounding films thereof, such as the semiconductor substrate 11. As materials of the film, for example, silicon nitride and aluminum oxide are exemplified. In addition, a material selected in consideration of a reflective component attributable to optical interference in the upper electrode film 117 (a transparent conductive film) is more desirable, and in the case in which ITO is used for the upper electrode film 117, for example, silicon nitride may be used. That is because ITO and silicon nitride easily reduce an interference effect due to similar refractive indices thereof.

The organic photoelectric conversion layer 116 is formed on the lower electrode film 113. The organic photoelectric conversion layer 116 is an organic film that converts light into an electric signal and is formed of a p-type photoelectric conversion material. The p-type photoelectric conversion material contained in the organic photoelectric conversion layer 116 desirably has at least one of a hole transporting property and an electron transporting property regardless of a wavelength that the material absorbs.

Note that the p-type photoelectric conversion material may be a quinacridone derivative, a phthalocyanine derivative, a porphyrin derivative, a squarylium derivative, a naphthalene or a perylene derivative, a cyanin derivative, a merocyanine derivative, a rhodamine derivative, a diphenylmethane or triphenylmethane derivative, a xanthene derivative, an acridine derivative, a phenoxazine derivative, a quinoline derivative, an oxazole derivative, a thiazole derivative, an oxazine derivative, a thiazine derivative, a benzoquinone derivative, a naphthoquinone derivative, an anthraquinone derivative, an indigo or thioindigo derivative, a pyrrole derivative, a pyridine derivative, a dipyrrin derivative, an indole derivative, a diketopyrrolopyrrole derivative, a cumarin derivative, a fluorene derivative, a fluoranthene derivative, an anthracene derivative, a pyrene derivative, a triarylamine derivative such as triphenylamine, naphthylamine, and styrylamine, a carbazole derivative, a phenylenediamine derivative or a benzidine derivative, a phenanthroline derivative, an imidazole derivative, an oxazoline derivative, a thiazoline derivative, a triazole derivative, a thiadiazole derivative, an oxadiazole derivative, a thiophene derivative, a selenophene derivative, a silole derivative, a germole derivative, a stilbene derivative or a phenylenevinylene derivative, a pentacene derivative, a rubrene derivative, a thienothiophene derivative, a benzodithiophene derivative, a xanthenoxanthene derivative, a fullerene derivative, and the like.

In addition, the p-type photoelectric conversion material may be a coupled body, a multimer, a polymer, a copolymer, a block copolymer, or the like having the above-described substituent groups as a unit structure.

In particular, a quinacridone derivative is desirable as the p-type photoelectric conversion material contained in the photoelectric conversion films according to the present technology.

A thickness of the organic photoelectric conversion layer 116 configured as described above is, for example, 50 nm to 250 nm.

Although a spin coating method or a coating method using injection may be used as a method for forming a thin film of the organic photoelectric conversion layer 116, a vacuum evaporation method is the most appropriate method for easily obtaining material characteristics thereof.

The upper electrode film 117 is formed on the organic photoelectric conversion layer 116 to cover the organic photoelectric conversion layer 116. The upper electrode film 117 is a film of a metal oxide with transparency formed of a material similar to that of the lower electrode films 113. The upper electrode film 117 is provided to be shared by each of the pixels 2. A thickness of the upper electrode film 117 is, for example, 50 nm to 150 nm.

Note that, although any of various methods may be used to produce the lower electrode films 113 and the upper electrode film 117, a resistance heating evaporation method, an electron beam method, or a sputtering method may be candidates therefor since organic semiconductor materials easily deteriorate in the atmosphere. The sputtering method is considered to be the most appropriate method since a film of a large area can be easily formed at a low temperature and a refractive index can be easily obtained through burning or annealing at a low temperature.

A sealing film 118 is formed on the upper electrode film 117 to cover the upper electrode film 117. However, the upper electrode film 117 is exposed at an end of the sealing film 118 (in a region corresponding to the surrounding circuit unit SC) to be connected to a contact wiring 119.

The sealing film 118 is, for example, a single layer film formed of one of silicon oxide, silicon nitride, silicon oxynitride, aluminum oxide, and the like, or a laminated layer film formed of two or more thereof. A thickness of the sealing film 118 is, for example, 100 nm to 1 µm.

One of a CVD method, an ALD method, a sputtering method, and the like may be used to produce the sealing film 118. The CVD method and the ALD method, which contribute to favorable coatability, may be preferably used to prevent infiltration of water vapor from the outside, which may be attributable to insufficient coating over a level difference part.

The contact wiring 119 is formed to cover the end of the sealing film 118 and to electrically connect an end of the upper surface of the upper electrode film 117 and the wiring layer 115. The contact wiring 119 may be formed of, for example, one of titanium, tungsten, titanium nitride, aluminum, and the like, or may be configured by a laminated film formed of two or more thereof.

A flattening film 120 is formed to cover an entirety of surfaces of the sealing film 118 and the contact wiring 119.

The on-chip lens 102 (microlens) is provided on the flattening film 120. The on-chip lens 102 enables light incident from above to be concentrated on the organic photoelectric conversion unit 101 and the light receiving faces of the inorganic photoelectric conversion units 142B and 142R.

In the present embodiment, since the multilayer wiring layer 103 is formed on the face S2 side of the semiconductor substrate 11, the organic photoelectric conversion unit 101 and the light receiving faces of the inorganic photoelectric conversion units 142B and 142R can be disposed to be close to each other. Accordingly, irregular sensitivity to different colors caused by an F number of the on-chip lens 102 may be reduced.

In addition, a through-hole is provided in each of a region of the interlayer insulating film 111 facing a contact wiring 144 and a region thereof facing another contact wiring 145 of the semiconductor substrate 11, and a contact wiring 121 and a contact wiring 123 are respectively embedded in the through-holes. A contact wiring 122 and a contact wiring 124 are respectively embedded in a region of the interlayer insulating film 112 facing the contact wiring 121 and a region thereof facing the contact wiring 123.

The contact wiring 121 and the contact wiring 122 function as a connector together with the contact wiring 144 and form a transfer path of carriers (holes) from the lower electrode film 113 to a green accumulation layer 143. The contact wiring 123 and the contact wiring 124 function as a connector together with the contact wiring 145, and form, together with the wiring layer 115 and the contact wiring 119, a discharge path of carriers (electrons) from the upper electrode film 117.

The contact wiring 121 and the contact wiring 123 are desirably formed of, for example, a laminated film of metallic materials such as titanium (Ti), titanium nitride (TiN), and tungsten to also function as a light shielding film. In addition, even in the case in which the contact wiring 144 and the contact wiring 145 are formed as p-type or n-type semiconductor layers using the laminated film, a contact property with silicon can be secured.

The semiconductor substrate 11 is formed of the inorganic photoelectric conversion unit 142B, the inorganic photoelectric conversion unit 142R, and the green accumulation layer 143 that are embedded in, for example, a predetermined region of the n-type silicon layer 141. In addition, the semiconductor substrate 11 has the contact wiring 144 and the contact wiring 145 embedded therein which serve as a transfer path of carriers (electrons or holes) from the organic photoelectric conversion unit 101.

In the present embodiment, the back surface (the face S1) of the semiconductor substrate 11 serves as a light receiving face. A plurality of pixel transistors (including transfer transistors Tr1 to Tr3) each corresponding to the organic photoelectric conversion unit 101, the inorganic photoelectric conversion units 142B, and the inorganic photoelectric conversion units 142R are formed, and surrounding circuits including logic circuits and the like are formed on the front surface (the face S2) side of the semiconductor substrate 11.

As the pixel transistors, for example, transfer transistors, reset transistors, amplification transistors, and selection transistors are exemplified. All of the pixel transistors are configured by, for example, MOS transistors, and are formed in a p-type semiconductor well region on the face S2 side. Such circuits including the pixel transistors are formed for each of red, green, and blue photoelectric conversion units. Each of the circuits may have a tri-transistor configuration including a total of three transistors that are, for example, a transfer transistor, a rest transistor, and an amplification transistor among the pixel transistors, or may have a quad-transistor configuration in which a selection transistor is added to the aforementioned configuration. Here, only the transfer transistors Tr1 to Tr3 are illustrated among the pixel transistors. In addition, pixel transistors other than the transfer transistor can be shared between the photoelectric conversion units or pixels. Further, the so-called pixel sharing structure in which a floating diffusion is shared can also be applied.

The transfer transistors Tr1 to Tr3 are configured to include gate electrodes (three gate electrodes) and three floating diffusions (FD). Among these, the three gate electrodes are provided inside the multilayer wiring layer 103, and the three FDs are formed inside the semiconductor substrate 11. The transfer transistor Tr1 transfers signal charges (holes in the present embodiment) corresponding to green generated in the organic photoelectric conversion unit 101 and accumulated in the green accumulation layer 143 to the vertical signal lines 9. The transfer transistor Tr2 transfers signal charges (here, holes) corresponding to blue generated and accumulated in the inorganic photoelectric conversion units 142B to the vertical signal lines 9. Likewise, the transfer transistor Tr3 transfers signal charges (holes in the present embodiment) corresponding to red generated and accumulated in the inorganic photoelectric conversion units 142R to the vertical signal lines 9.

The inorganic photoelectric conversion unit 142B and the inorganic photoelectric conversion unit 142R are photodiodes with p-n junctions, and are formed in order of the inorganic photoelectric conversion unit 142B and the inorganic photoelectric conversion unit 142R from the face S1 side on an optical path inside the semiconductor substrate 11. The inorganic photoelectric conversion unit 142B selectively detects blue light and accumulates signal charges corresponding to blue, and is formed to extend, for example, from a selected region along the face S1 of the semiconductor substrate 11 to a region near an interface with the multilayer wiring layer 103. The inorganic photoelectric conversion unit 142R selectively detects red light and accumulates signal charges corresponding to red, and is formed throughout a region in, for example, a layer lower than the inorganic photoelectric conversion unit 142B (on the face S2 side). Note that blue (B) is a color corresponding to a wavelength band of, for example, 450 m to 495 nm, and red (R) is a color corresponding to a wavelength band of, for example, 620 nm to 750 nm, and each of the inorganic photoelectric conversion units 142B and 142R may detect light of a part of the above-described wavelength bands or the entire wavelength bands.

The green accumulation layer 143 is configured to include, for example, a p-type region serving as a hole accumulation layer. A part of the p-type region is connected to the contact wiring 144 and accumulates holes transferred from the lower electrode film 113 side via the contact wiring 144, The contact wiring 144 is electrically connected with the lower electrode film 113 of the organic photoelectric conversion unit 101, and is connected to the green accumulation layer 143. The contact wiring 145 is electrically connected to the upper electrode film 117 of the organic photoelectric conversion unit 101 and serves as wiring for discharging electrons.

Each of the contact wiring 144 and the contact wiring 145 is formed in a way that, for example, buries a conductive film material such as tungsten in through-vias. In this case, it is desirable to cover side surfaces of the vias with an insulating film formed of silicon oxide (SiO2), silicon nitride (SiN), or the like in order to, for example, suppress short-circuiting with silicon. Alternatively, the contact wiring 144 and the contact wiring 145 may be formed to be embedded by conductive semiconductor layers. In this case, the contact wiring 144 should be a p type wiring (to serve as a transfer path of holes), and the contact wiring 145 should be an n type wiring (to serve as a transfer path of electrons).

The multilayer wiring layer 103 is formed on the face S2 of the semiconductor substrate 11. A plurality of wirings 162 are installed in the multilayer wiring layer 103 via an interlayer insulating film 161. As described above, the multilayer wiring layer 103 is formed on a side opposite the light receiving faces in the pixels 2, and accordingly the so-called backside irradiation type solid-state imaging device is realized. The support substrate 104 formed of silicon, for example, is bonded to the multilayer wiring layer 103.

The above-configured solid-state imaging device 1 acquires light reception signals, for example, as follows.

First, green light of light incident on the pixels 2 is selectively detected (absorbed) and photoelectrically converted by the organic photoelectric conversion unit 101. Holes of electron-hole pairs generated as described above are taken from the lower electrode film 113 side and then accumulated in the green accumulation layer 143 via the contact wiring 122, the contact wiring 121, and the contact wiring 144. The accumulated holes are read through the vertical signal lines 9 via pixel transistors, which are not illustrated, at a time of a reading operation. Note that electrons are discharged from the upper electrode film 117 side via the contact wiring 119, the wiring layer 115, the contact wiring 124, the contact wiring 123, and the contact wiring 145.

Subsequently, blue light and red light that have passed through the organic photoelectric conversion unit 101 are absorbed and photoelectrically converted by the inorganic photoelectric conversion units 142B and the inorganic photoelectric conversion units 142R, respectively, in order. Holes corresponding to the incident blue light are accumulated in the p-type region in the inorganic photoelectric conversion units 142B, and the accumulated holes are read through the vertical signal lines 9 via the pixel transistors, which are not illustrated, at the time of the reading operation. Note that electrons are accumulated in an n-type region which is not illustrated. Likewise, holes corresponding to the incident red light are accumulated in the p-type region in the inorganic photoelectric conversion units 142R, and the accumulated holes are read through the vertical signal lines 9 via the pixel transistors, which are not illustrated, at the time of the reading operation. Note that electrons are accumulated in the n-type region which is not illustrated.

As described above, red, green, and blue light can be separately detected without color filters by laminating the organic photoelectric conversion unit 101 and the inorganic photoelectric conversion units 142B and 142R in a vertical direction, and signal charges of the light can be obtained. Thus, light loss (a decrease in sensitivity) caused by color light absorption of the color filters or generation of a false color resulting from pixel interpolation can be reduced.

{First Configuration Example of Organic Photoelectric Conversion Layer 116}

Figure 3:
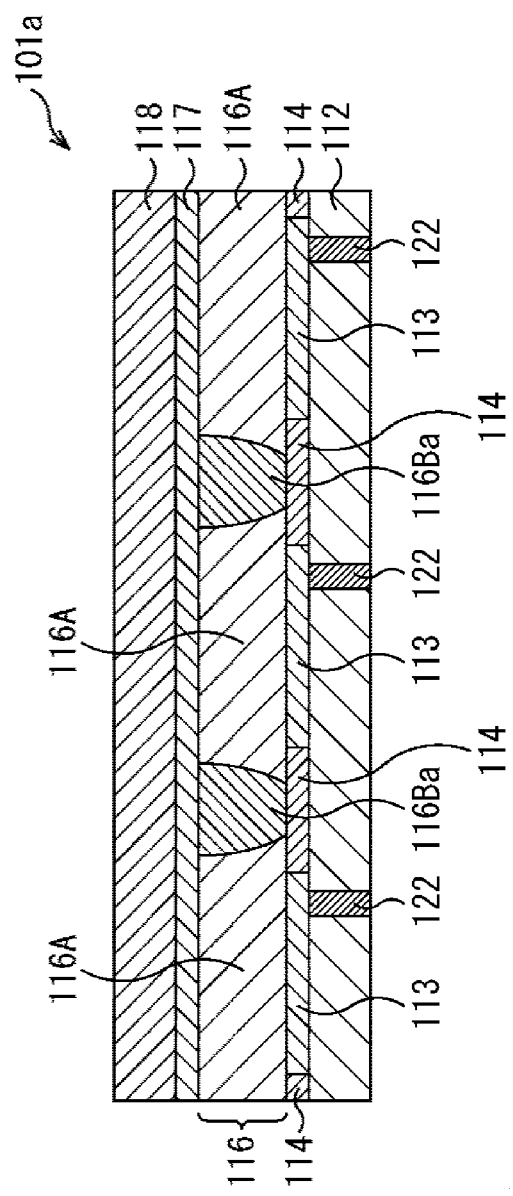
FIG. 3 is a cross-sectional diagram illustrating a first embodiment of an organic photoelectric conversion layer.
Figure 4:
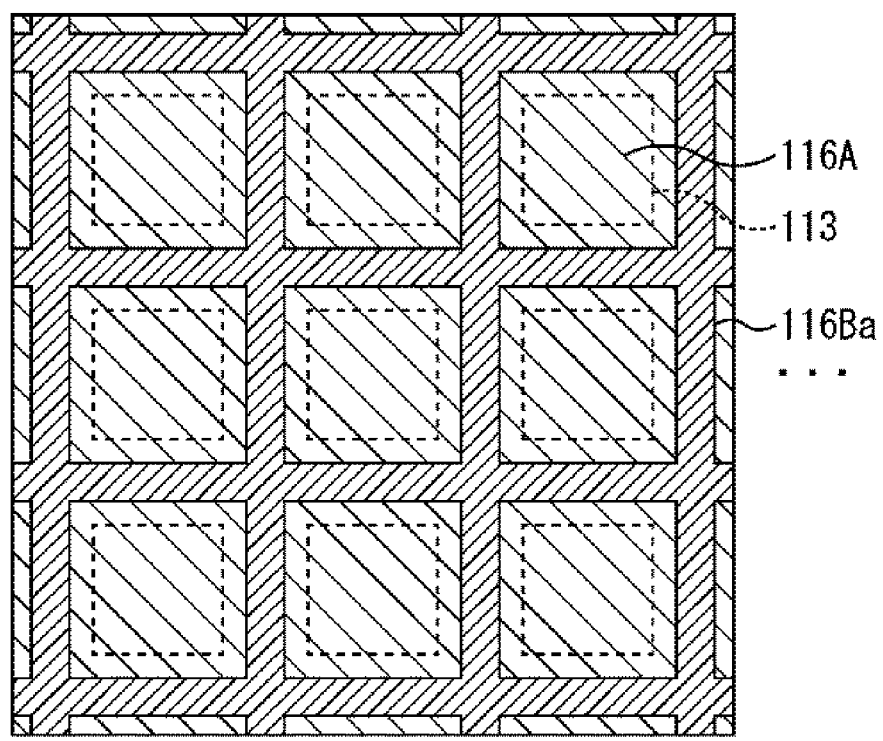
FIG. 4 is a diagram for illustrating positions of suppression regions in the first embodiment of the organic photoelectric conversion layer.

Next, a first configuration example of the organic photoelectric conversion layer 116 of the solid-state imaging device 1 will be described with reference to FIGS. 3 and 4. FIG. 3 is a cross-sectional diagram in which a periphery of lower electrode films 113, an organic photoelectric conversion layer 116, and an upper electrode film 117 of an organic photoelectric conversion unit 101a, which is the first embodiment of the organic photoelectric conversion unit 101, is enlarged. FIG. 4 is a diagram in which the organic photoelectric conversion layer 116 is viewed from above (an incidence side of light incident on the organic photoelectric conversion layer 116) schematically illustrating a positional relationship between a photoelectric conversion region 116A, suppression regions 116Ba, and the lower electrode films 113.

The upper electrode film 117 and the organic photoelectric conversion layer 116 are formed to be linked to each other between pixels 2 and shared by the pixels 2, as described above. Meanwhile, the lower electrode films 113 are segmented by interlayer insulating films 114 that are formed between adjacent pixels, and thus are discontinuous between the pixels.

In addition, green light of the light incident on the organic photoelectric conversion layer 116 via a sealing film 118 and the upper electrode film 117 is selectively detected (absorbed) and photoelectrically converted by the organic photoelectric conversion layer 116. Holes of carriers (electron-hole pairs) generated as described above are read as a signal toward the lower electrode films 113 due to an electric field generated between the upper electrode film 117 and the lower electrode films 113.

At this time, in the organic photoelectric conversion layer 116, electric fields of regions in which the upper electrode film 117 faces the interlayer insulating films 114 (which will be referred to as non-inter-electrode regions below) are weaker than electric fields of regions in which the upper electrode film 117 faces the lower electrode films 113 (which will be referred to as inter-electrode regions below). Note that, in other words, the inter-electrode regions are regions interposed between the upper electrode film 117 and the lower electrode films 113, and the non-interelectrode regions are regions that are not interposed between the upper electrode film 117 and the lower electrode films 113. In addition, the non-interelectrode regions are interpixel regions interposed between adjacent pixels 2.

If no particular countermeasure is taken, reading of carriers generated in the non-inter-electrode regions is performed later than reading of carriers generated in the inter-electrode regions due to an intensity difference between the electric fields. As a result, carriers remain in the non-inter-electrode regions, and afterimages occur over a plurality of frames due to the residual carriers.

With regard to this problem, the suppression regions 116Ba are formed inside the non-inter-electrode regions of the organic photoelectric conversion layer 116 in the solid-state imaging device 1. The suppression regions 116Ba are formed in parallel with ends of the inter-electrode regions (ends of the pixels 2 and ends of the lower electrode films 113) and extend from an upper surface to a lower surface of the organic photoelectric conversion layer 116. The photoelectric conversion regions 116A of the organic photoelectric conversion layer 116 are segmented by the suppression regions 116 Ba, and thus become discontinuous.

The suppression regions 116 Ba have different properties, more specifically have different electrical characteristics, from surrounding photoelectric conversion regions 116A, and at least one of generation and movement of carriers is suppressed further in the suppression regions than in the photoelectric conversion regions 116A. Here, the electrical characteristics include at least one of carrier concentration, degree of movement, and band configuration. In addition, in order to have the different electrical characteristics, the photoelectric conversion regions 116A and the suppression regions 116Ba are different in at least one factor of an integration state, a crystalline orientation, and a composition.

By providing the suppression regions 116Ba in the non-inter-electrode regions of the organic photoelectric conversion layer 116 as described above, at least one of the generation and movement of carriers in the non-inter-electrode regions is suppressed. As a result, residual carriers decrease in the non-inter-electrode regions, and occurrence of afterimages is suppressed.

{Manufacturing Method of Suppression Regions 116Ba}

Next, a manufacturing method of the suppression regions 116Ba will be described with reference to FIG. 5.

First, after the sealing film 118 is formed on the upper electrode film 117 to prevent the organic photoelectric conversion layer 116 from being affected by the atmosphere, a resist 201 is coated on the sealing film 118.

Next, patterning and development of the resist 201 are performed. Accordingly, openings 201A are formed above the non-inter-electrode regions in which the interlayer insulating films 114 are formed but no lower electrode films 113 are present.

Figure 5:
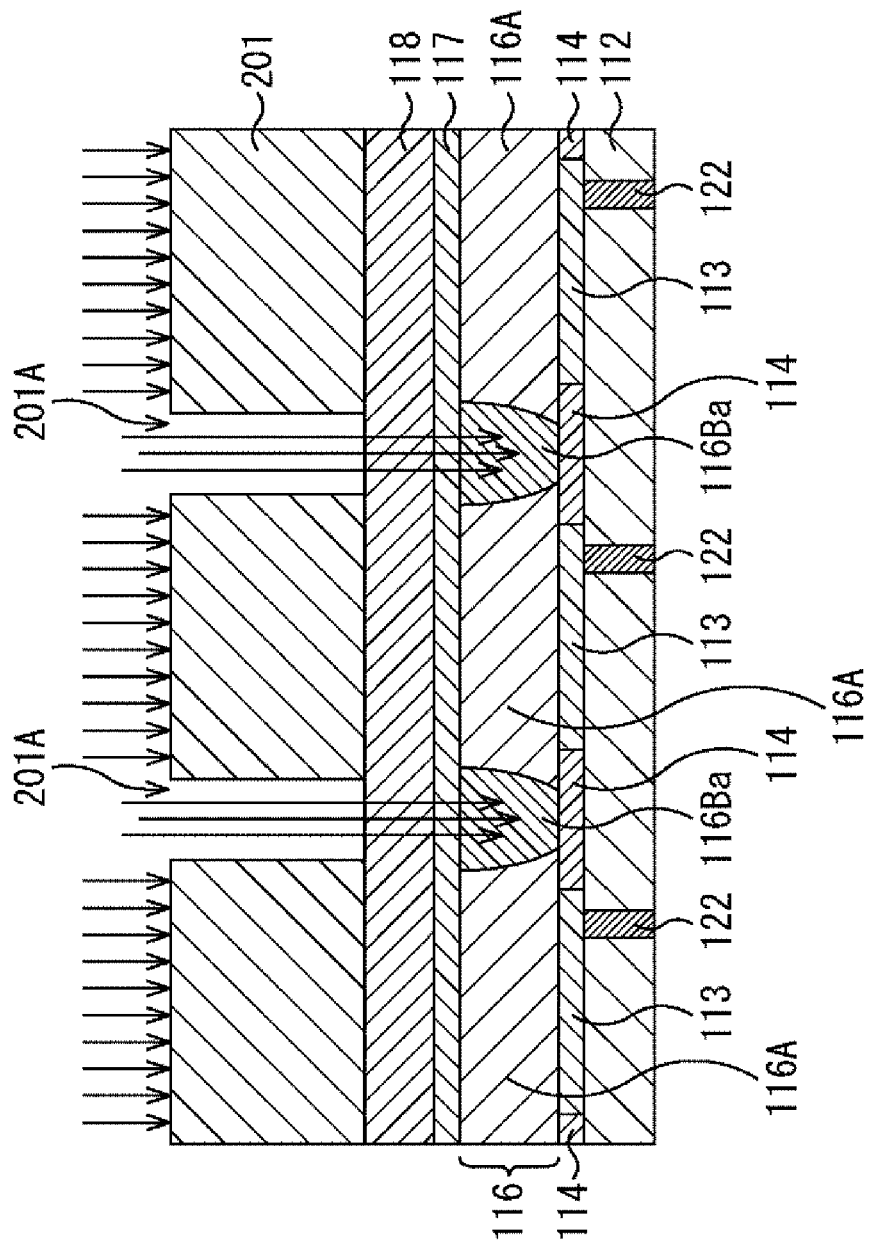
FIG. 5 is a diagram for describing a manufacturing method of suppression regions in the first embodiment of the organic photoelectric conversion layer.

Next, ultraviolet light (UV light) is irradiated onto the resist 201 from above, as indicated by the arrows in FIG. 5. At this time, the amount of ultraviolet light irradiated is set to exceed an amount of light absorption of the sealing film 118 and the upper electrode film 117. The amount of ultraviolet light irradiated is set such that, for example, the light reaches the organic photoelectric conversion layer 116 with energy of about 10 eV to 100 eV, which is greater than or equal to binding energy of the organic photoelectric conversion layer 116, by taking interference of multi-layer films into account. As a result, ultraviolet light incident on the openings 201A of the resist 201 passes through the sealing film 118 and the upper electrode film 117 and is then irradiated toward the organic photoelectric conversion layer 116. In addition, a wavelength of the ultraviolet light is set to be a wavelength serving as an energy region in which at least one of an integration state, a crystal state, and a composition of the organic photoelectric conversion layer 116 is changed. The wavelength of the ultraviolet light is set to, for example, 150 to 400 nm.

Accordingly, the suppression regions 116Ba are formed inside the non-inter-electrode regions of the organic photoelectric conversion layer 116.

Note that the suppression regions 116Ba may be generated using, for example, an ion implantation method, instead of ultraviolet light irradiation. As ions to be implanted, for example, ions of elements such as hydrogen, helium, boron, carbon, nitrogen, oxygen, fluorine, neon, magnesium, aluminum, silicon, phosphorus, sulfur, chlorine, and argon are considered.

In addition, the suppression regions 116Ba may be formed by performing a process of changing a crystalline orientation of an organic film on the lower electrode films 113 and the interlayer insulating films 114 in, for example, pre-processing for forming an organic evaporated film.

{First Modified Example of Suppression Regions}

Figure 6:
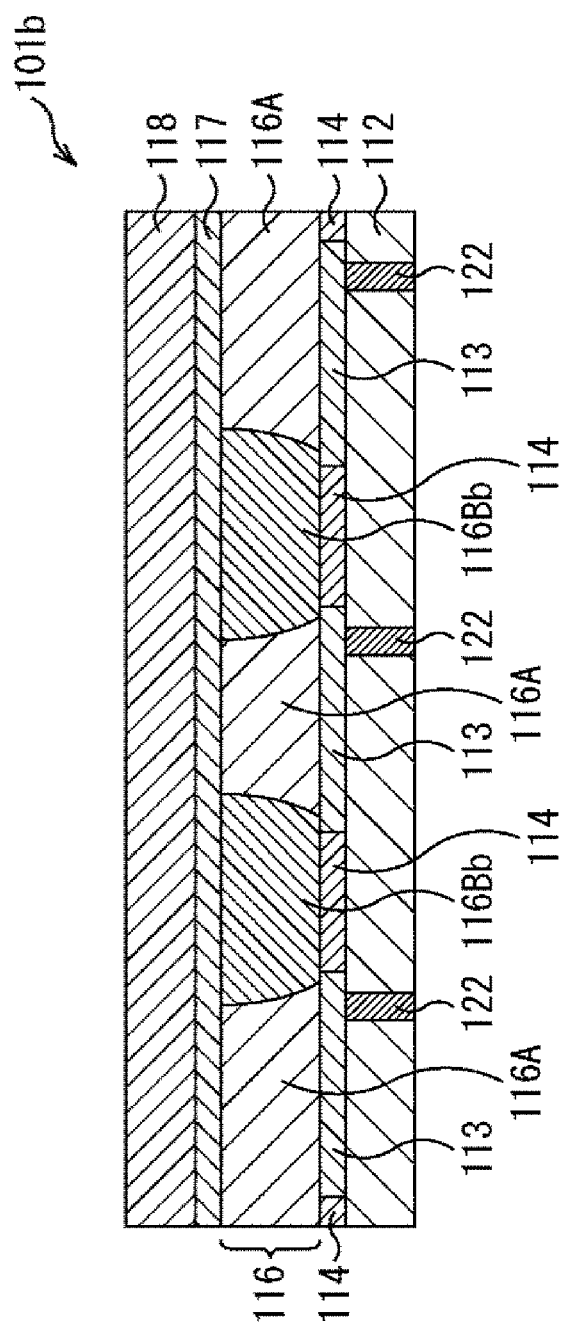
FIG. 6 is a cross-sectional diagram illustrating a second embodiment of the organic photoelectric conversion layer.
Figure 7:
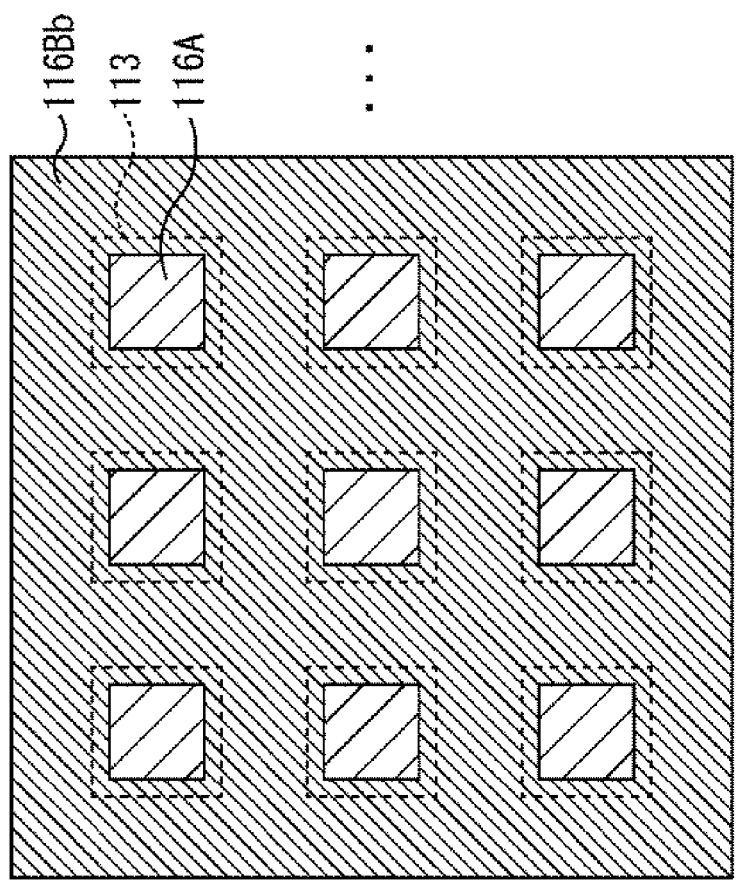
FIG. 7 is a diagram for describing positions of suppression regions in the second embodiment of the organic photoelectric conversion layer.

Next, a first modified example of the suppression regions will be described with reference to FIGS. 6 and 7. FIG. 6 is a cross-sectional diagram in which a periphery of lower electrode films 113, an organic photoelectric conversion layer 116, and an upper electrode film 117 of an organic photoelectric conversion unit 101b, which is a second embodiment of the organic photoelectric conversion unit 101, is enlarged, as in FIG. 3. FIG. 7 is a diagram in which the organic photoelectric conversion layer 116 is viewed from above (an incidence side of light incident on the organic photoelectric conversion layer 116) schematically illustrating a positional relationship between photoelectric conversion regions 116A, suppression regions 116Bb, and the lower electrode films 113, as in FIG. 4.

The suppression regions 116Bb of FIGS. 6 and 7 have a different width in a horizontal direction from that of the suppression regions 116Ba of FIGS. 3 and 4.

Specifically, the width of each of the suppression regions 116Ba is formed not to exceed a width of each interlayer insulating film 114, and the suppression regions 116Ba are included in a range of non-inter-electrode regions, as illustrated in FIGS. 3 and 4. Thus, the suppression regions 116Ba do not overlap the lower electrode films 113 when viewed from above, and an entire upper surface of each of the lower electrode films 113 is covered by the photoelectric conversion regions 116A, as illustrated in FIG. 4.

On the other hand, the width of each of the suppression regions 116Bb exceeds the width of each of the interlayer insulating films 114 on upper and lower surfaces of the organic photoelectric conversion layer 116, and the suppression regions 116Bb extend into inter-electrode regions, as illustrated in FIGS. 6 and 7. Thus, ends of the lower electrode film 113 are covered by parts of the suppression regions 116Bb when viewed from above, as illustrated in FIG. 7.

Thus, although sensitivity is slightly lowered in the example of FIGS. 6 and 7, residual carriers are further reduced in the non-inter-electrode regions and occurrence of afterimages is further suppressed when compared to the example of FIGS. 3 and 4.

Note that, although the example in which the width of each of the suppression regions 116Bb extends from the non-inter-electrode region on the upper and lower surfaces of the organic photoelectric conversion layer 116 has been introduced in FIG. 6, the width of each of the suppression region 116Bb may be set, for example, to extend from the non-inter-electrode regions on the upper surface of the organic photoelectric conversion layer 116 and not to extend from the non-inter-electrode regions on the lower surface of the organic photoelectric conversion layer 116.

{Second Modified Example of Suppression Regions}

Figure 8:
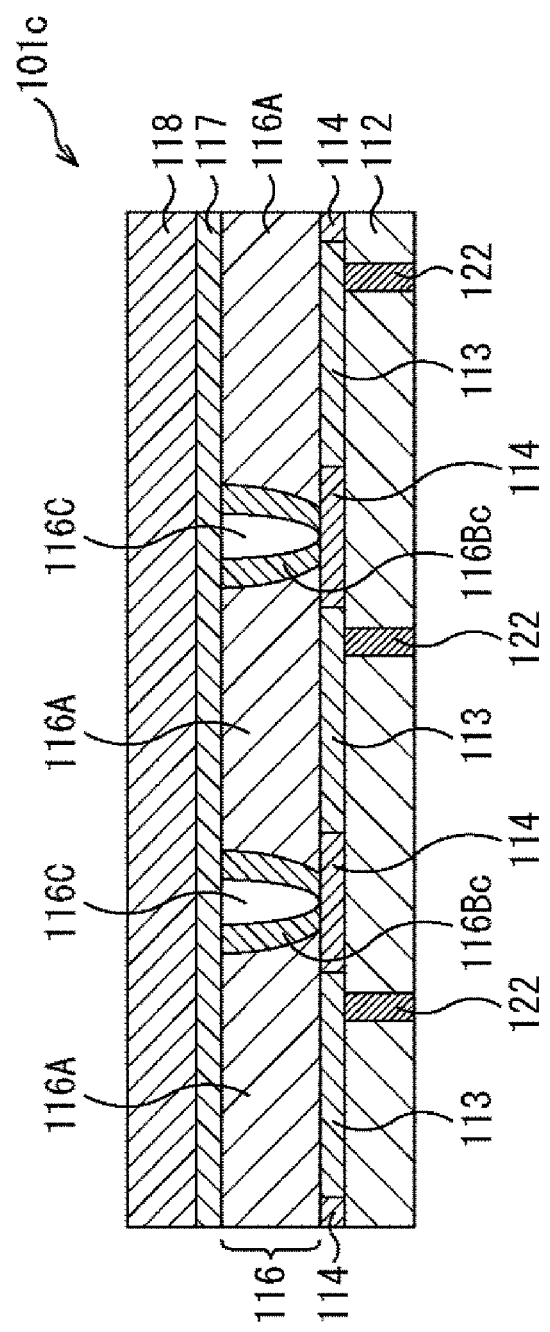
FIG. 8 is a cross-sectional diagram illustrating a third embodiment of the organic photoelectric conversion layer.

Next, a second modified example of the suppression regions will be described with reference to FIG. 8. FIG. 8 is a cross-sectional diagram in which a periphery of lower electrode films 113, an organic photoelectric conversion layer 116, and an upper electrode film 117 of an organic photoelectric conversion unit 101c, which is a third embodiment of the organic photoelectric conversion unit 101, is enlarged, as in FIG. 3

Suppression regions 116Bc of FIG. 8 are different from the suppression regions Ba of FIG. 3 in that hollow grooves (voids) 116C are formed inside the suppression regions 116Bc.

The hollow grooves 116C are formed to be parallel with ends of inter-electrode regions (ends of pixels 2 or ends of the lower electrode films 113) substantially at the centers of the suppression regions 116Bc in a horizontal direction, and pass through the organic photoelectric conversion layer 116 in a vertical direction. The suppression regions 116Bc are segmented by the hollow grooves 116C, and thus become discontinuous.

Accordingly, the photoelectric conversion regions 116A of adjacent pixels 2 are electrically isolated more reliably. As a result, residual carriers further decrease in non-inter-electrode regions, and occurrence of afterimages is further suppressed.

{Manufacturing Method of Hollow Grooves 116C}

Next, a manufacturing method of the hollow grooves 116C will be described with reference to FIGS. 9 and 10.

The hollow grooves 116C can be formed by increasing an amount of ultraviolet light irradiated or an irradiation time thereof to be more than in the case described above with reference to FIG. 5.

Figure 9:
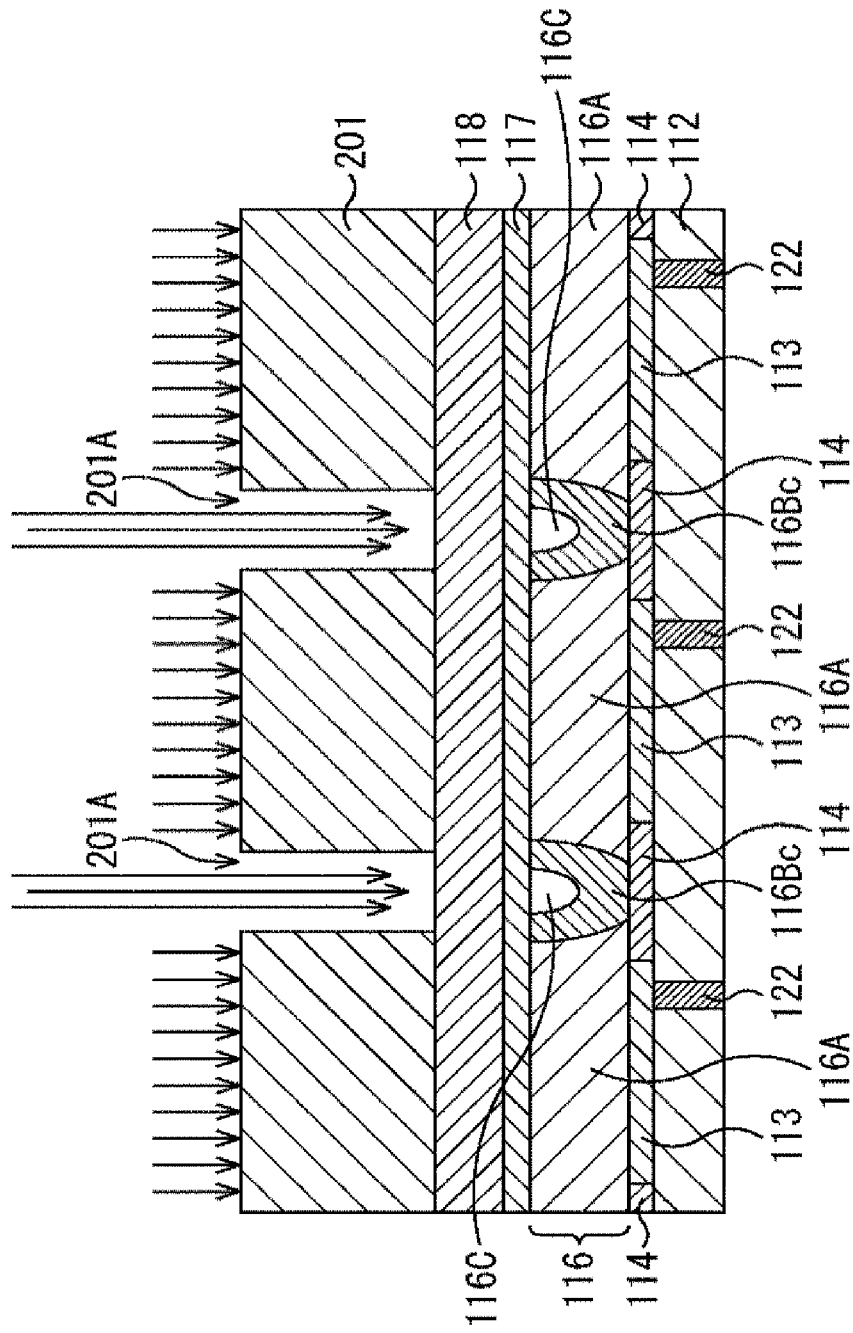
FIG. 9 is a diagram for describing a manufacturing method of hollow grooves of suppression regions.
Figure 10:
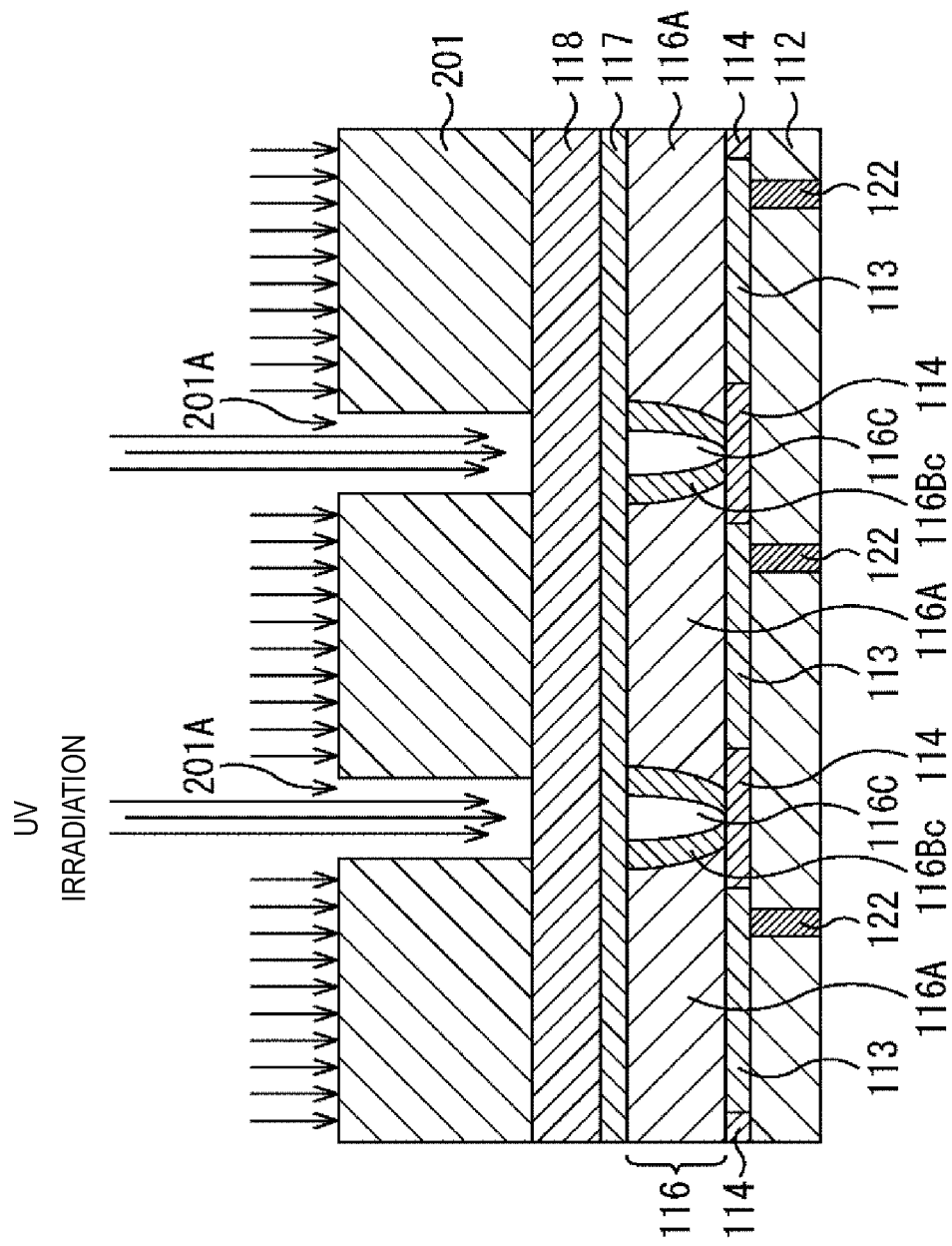
FIG. 10 is a diagram for describing the manufacturing method of hollow grooves of suppression regions.

In other words, by increasing the amount of ultraviolet light irradiated and the irradiation time thereof, the hollow grooves 116C are gradually formed from an upper side of the suppression regions 116Bc, as illustrated in FIG. 9. Then, by continuously irradiating ultraviolet light, the hollow grooves 116C finally reach the bottom of the organic photoelectric conversion layer 116, as illustrated in FIG. 10.

Note that, the irradiation of ultraviolet light may be stopped before the hollow grooves 116C reach the bottom of the organic photoelectric conversion layer 116, as illustrated in FIG. 9. That is, the hollow grooves 116C may not necessarily pass through the organic photoelectric conversion layer 116.

However, when the hollow grooves 116C pass through the organic photoelectric conversion layer 116, the photoelectric conversion regions 116A of adjacent pixels 2 are more reliably electrically isolated and occurrence of afterimages can be more reliably suppressed.

{Third Modified Example of the Suppression Regions}

Figure 11:
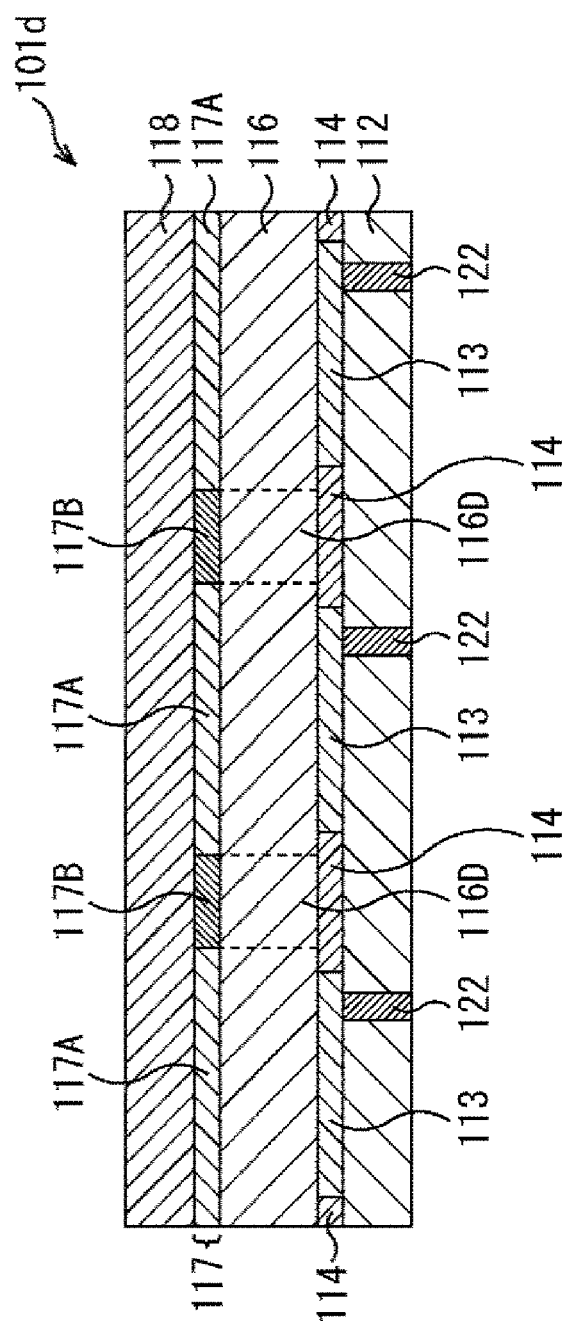
FIG. 11 is a cross-sectional diagram illustrating a fourth embodiment of the organic photoelectric conversion layer.
Figure 12:
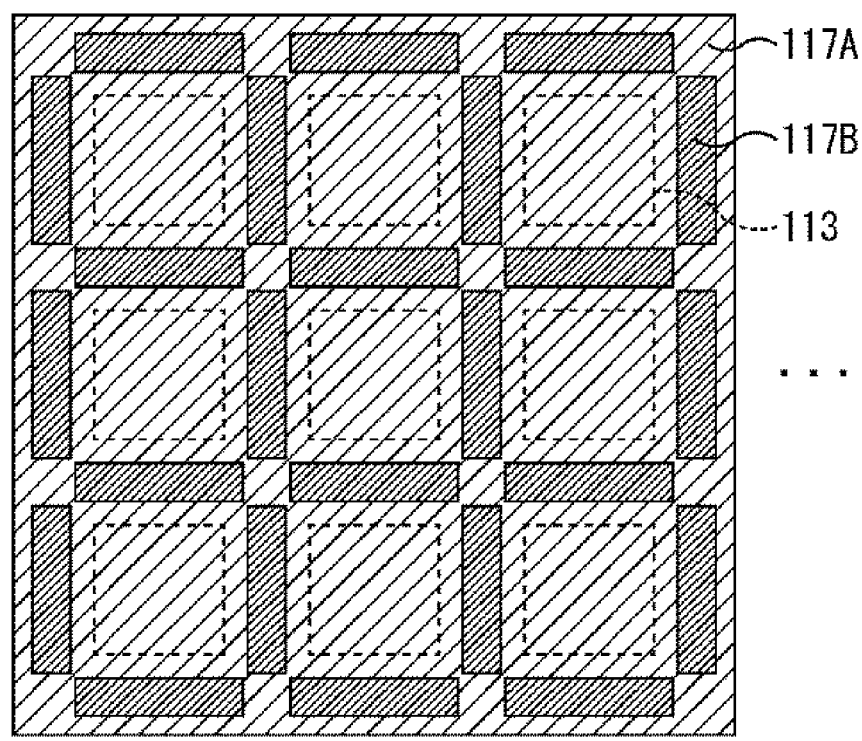
FIG. 12 is a diagram for describing a first example of positions of high resistance regions in the fourth embodiment of the organic photoelectric conversion layer.

Next, a third modified example of the suppression regions will be described with reference to FIG. 11 to FIG. 13. FIG. 11 is a cross-sectional diagram in which a periphery of lower electrode films 113, an organic photoelectric conversion layer 116, and an upper electrode film 117 of an organic photoelectric conversion unit 101d, which is a fourth embodiment of the organic photoelectric conversion unit 101, is enlarged, as in FIG. 3. FIG. 12 is a diagram in which the upper electrode film 117 is viewed from above (an incidence side of light incident on the organic photoelectric conversion layer 116) schematically illustrating a positional relationship between normal resistance regions 117A, high resistance regions 117B, and the lower electrode films 113.

The organic photoelectric conversion unit 101d of FIG. 11 is different from the organic photoelectric conversion unit 101a of FIG. 3 in terms of a configuration of the organic photoelectric conversion layer 116 and the upper electrode film 117.

Specifically, an entire region of the organic photoelectric conversion layer 116 is substantially homogeneous with no suppression regions 116Ba formed therein.

Meanwhile, the high resistance regions 117B are formed in regions of the upper electrode film 117 facing interlayer insulating films 114. The high resistance regions 117B are different from the surrounding normal electrode regions 117A in at least one factor including an integration state, a composition, and a thickness thereof and have higher electric resistance than the normal electrode regions 117A. Note that it is desirable for a resistance value of the high resistance regions 117B to be as high as possible.

As illustrated in FIG. 12, the high resistance regions 117B are formed to entirely surround each of the lower electrode films 113. However, the high resistance regions 117B entirely surrounding each of the lower electrode films 113 are segmented at each side. In other words, each of the high resistance regions 117B is formed in a linear shape along the sides of each lower electrode film 113, and the high resistance regions 117B corresponding to the sides are not connected to each other. Thus, the normal resistance regions 117A of the upper electrode film 117 are continuous between pixels, and, by applying a voltage to a spot of the normal resistance regions 117A, the normal resistance regions 117A of the upper electrode film 117 of each pixel have substantially the same electric potential. Therefore, the pixels can be driven with a single power supply.

In addition, it is harder for suppression regions 116D surrounded by dotted lines and facing the high resistance regions 117B (right below the high resistance regions 117B) of the organic photoelectric conversion layer 116 of FIG. 11 to form an electric field than surrounding regions, and thus movement of carriers is suppressed. Thus, even when carriers are generated inside the suppression regions 116D, most of the generated carriers stay inside the suppression regions 116D and quickly disappear. As a result, residual carriers decrease in non-inter-electrode regions and occurrence of afterimages is suppressed.

Figure 13:
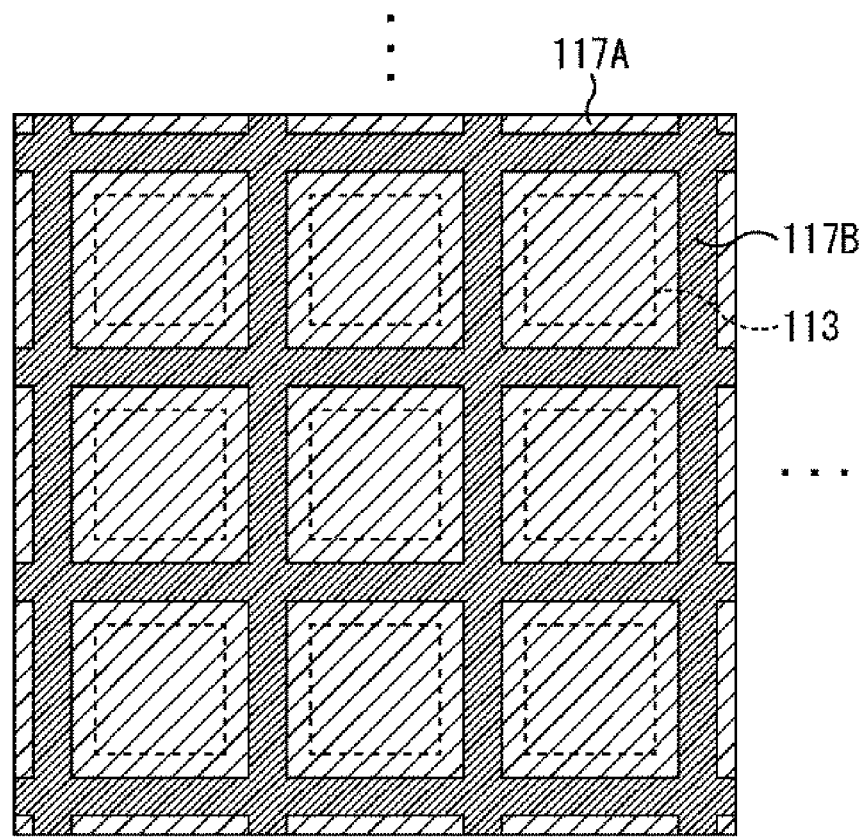
FIG. 13 is a diagram for describing a second example of positions of high resistance regions in the fourth embodiment of the organic photoelectric conversion layer.

Note that the high resistance regions 117B entirely surrounding each of the lower electrode films 113 can be connected to each other to form the high resistance regions 117B in a grid shape, as illustrated in FIG. 13. In this case, since the normal resistance regions 117A of the upper electrode film 117 are segmented by the high resistance regions 117B for each of the pixels, power sources for applying voltages to the normal resistance regions 117A, for example, may be provided for the pixels.

In the example of FIG. 13, in comparison to the example of FIG. 12, the normal resistance regions 117A of the pixels are completely separated from each other by the high resistance regions 117B, and the pixels are completely separated from each other by the suppression regions 116D. Accordingly, residual carriers further decrease and occurrence of afterimages is further suppressed.

In addition, although the example of FIG. 11 shows that the width of each of the high resistance regions 117B is narrower than the width of each of the interlayer insulating films 114, it is desirable for the width of the high resistance region 117B to be as close to the width of the interlayer insulating film 114 as possible. However, if the width of the high resistance region 117B is wider than the width of the interlayer insulating film 114, the high resistance regions 117B blocks ends of the lower electrode films 113, which causes sensitivity of the pixels to deteriorate, and thus it is desirable for the width of each high resistance region 117B to be equal to or narrower than the width of each interlayer insulating film 114.

{Manufacturing Method of High Resistance Regions 117B}

Next, a manufacturing method of the high resistance regions 117B will be described with reference to FIG. 14.

First, after the upper electrode film 117 is formed, a resist 211 is coated on the upper electrode film 117 to prevent the organic photoelectric conversion layer 116 from being affected by the atmosphere.

Next, patterning and development of the resist 211 are performed. Accordingly, openings 211A are formed in part of or over an entirety of regions of the resist 211 above non-inter-electrode regions in which the interlayer insulating films 114 are formed but no lower electrode film 113 is present.

Figure 14:
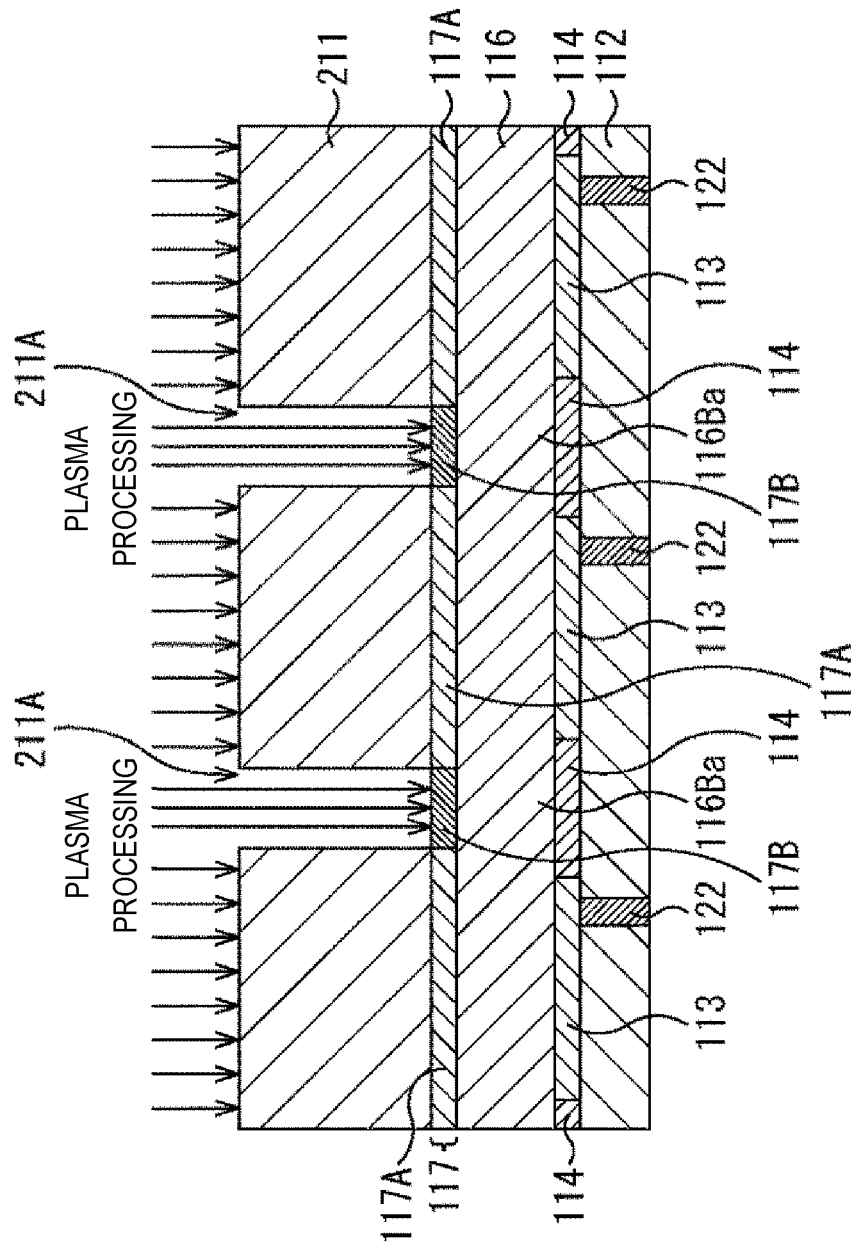
FIG. 14 is a diagram for describing a manufacturing method of the high resistance regions in the fourth embodiment of the organic photoelectric conversion layer.

Next, plasma is radiated from above the resist 211, as indicated by the arrows in FIG. 14. Gas to be used as the plasma is assumed to be, for example, O2, H2, CxFy, CxFyHz, rare gas (e.g. Ar, or the like), halogen (e.g. Cl2 or the like). Accordingly, at least one of an integration state and a composition of portions of the upper electrode film 117 that are exposed to the openings 211A of the resist 211 changes, and thereby the high resistance regions 117B are formed.

Note that the high resistance regions 117B may be formed using ultraviolet light irradiation, ion implantation, or the like instead of the plasma processing.

{Modified Example of High Resistance Regions 117B}

The high resistance regions 117B may be formed by, for example, thinning parts of the upper electrode film 117 through etching or the like instead of changing at least one of the integration state and composition of the upper electrode film 117 as described above. That is, high resistance may be realized by making the high resistance regions 117B thinner than the surrounding normal resistance regions 117A. In addition, at least one of integration information and the composition of the high resistance regions 117B may be changed and the high resistance regions 117B may be made thinner at the same time.

2. Second Embodiment (Example of EL Device)

{Configuration Example of Organic EL Unit}

Figure 15:
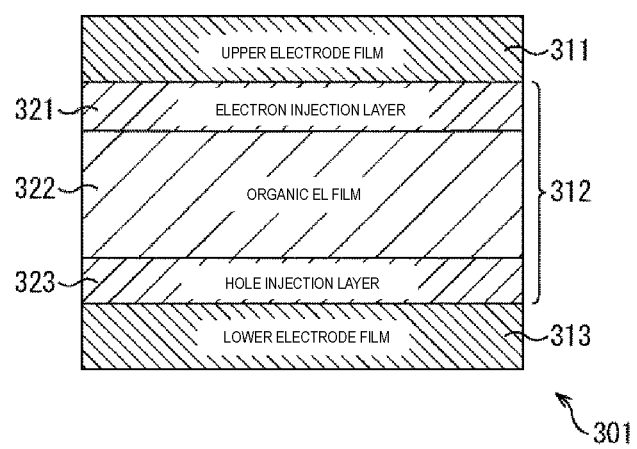
FIG. 15 is a cross-sectional diagram illustrating an example of an organic EL unit.

FIG. 15 is a cross-sectional diagram illustrating an example of a configuration of an organic EL unit according to a second embodiment of the present technology.

An organic EL unit 301 illustrated in FIG. 15 is used in, for example, an organic EL display 351a of FIG. 16 and an organic EL display 351b of FIG. 17, which will be described below.

The organic EL unit 301 is configured to include an upper electrode film 311, an organic EL layer 312, and a lower electrode film 313.

The upper electrode film 311 and the lower electrode film 313 are configured to basically be similar to the upper electrode film 117 and the lower electrode film 113 of the solid-state imaging device 1, and thus repetitive descriptions thereof will be omitted here.

The organic EL layer 312 is constituted sequentially by an electron injection layer 321, an organic EL film 322, and a hole injection layer 323 from the top.

The electron injection layer 321 injects electrons from the upper electrode film 311 into the organic EL film 322. The hole injection layer 323 injects holes from the lower electrode film 313 into the organic EL film 322.

The organic EL film 322 is an organic film that emits light by exciting organic molecules by recombining the electrons from the electron injection layer 321 and the holes from the hole injection layer 323. Although the organic EL film 322 is formed of a different material from the organic photoelectric conversion layer 116 of FIG. 2, other configurations (a thickness and a formation method) thereof are the same as the layer.

{Configuration Example of First Embodiment of Organic EL Display}

Figure 16:
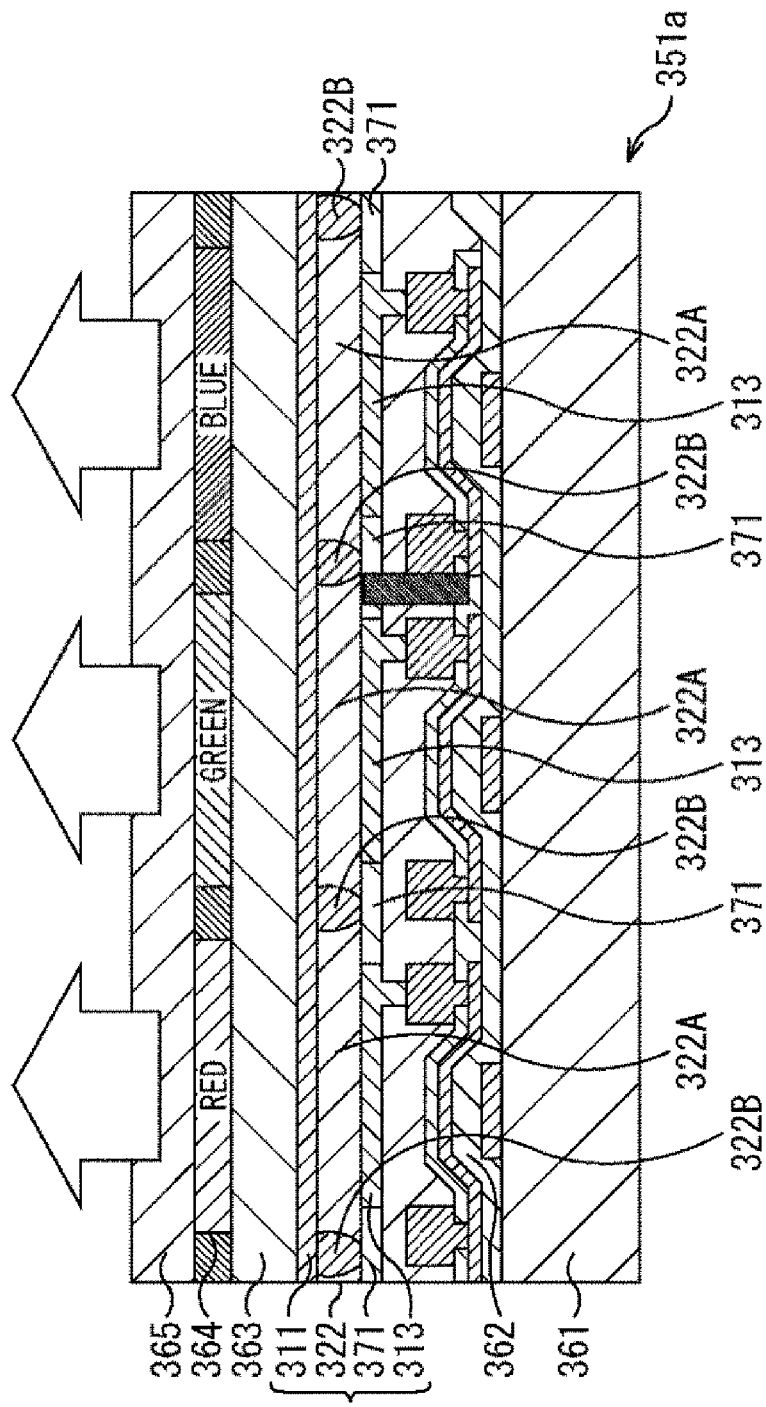
FIG. 16 is a cross-sectional diagram illustrating an example of an overall configuration of a first embodiment of an organic EL display with the organic EL unit.

FIG. 16 is a cross-sectional diagram illustrating an example of an overall configuration of an organic EL display 351a, which is a first embodiment of an organic EL display having the organic EL unit 301 of FIG. 15.

FIG. 16 illustrates an example of a cross-section of the organic EL display 351a of a top emission type in which color filters 364 are provided and the organic EL layer 312 is shared for all colors. That is, the organic EL display 351a has a glass substrate 361, a thin film transistor (TFT) 362, the organic EL unit 301, a sealing layer 363, the color filters 364, and sealing glass 365 sequentially laminated from a bottom thereof.

Note that, in this drawing, only the upper electrode film 311, the organic EL film 322, and the lower electrode film 313 of the organic EL unit 301 of FIG. 15 are illustrated.

In addition, like the above-described solid-state imaging device 1, the upper electrode film 311 and the organic EL film 322 are formed continuously between pixels and are shared by the pixels. On the other hand, the lower electrode film 313 is segmented by an interlayer insulating film 371 formed between adjacent pixels, and thus is discontinuous between the pixels.

Further, similarly to the organic photoelectric conversion layer 116 of the solid-state imaging device 1 of FIG. 3, the organic EL film 322 has suppression regions 322B formed within a non-inter-electrode region which is not interposed between the upper electrode film 311 and the lower electrode film 313. The suppression regions 322B are formed in parallel with ends of inter-electrode regions (ends of pixels or ends of the lower electrode film 313) and reach from an upper surface to a lower surface of the organic EL film 322. Photoelectric conversion regions 322A of the organic EL film 322 are segmented by the suppression regions 322B to be discontinuous.

In addition, light emitted from the organic EL film 322 is emitted to the outside via the upper electrode film 311, the sealing layer 363, the color filters 364, and the sealing glass 365, as indicated by the arrows of FIG. 16.

By providing the suppression regions 322B in the non-inter-electrode region of the organic EL film 322 as described above, at least one of generation and movement of carriers in the non-inter-electrode region is suppressed. As a result, residual carriers decrease in the non-inter-electrode region and occurrence of afterimages is suppressed.

Note that, by providing the suppression regions similar to the suppression region 116Bb of FIG. 6 in the organic EL film 322, the suppression region and hollow grooves having similar configurations to those of the suppression regions 116Bc and hollow grooves 116C of FIG. 8 may be provided in the organic EL film 322.

{Configuration Example of Second Embodiment of Organic EL Display}

Figure 17:
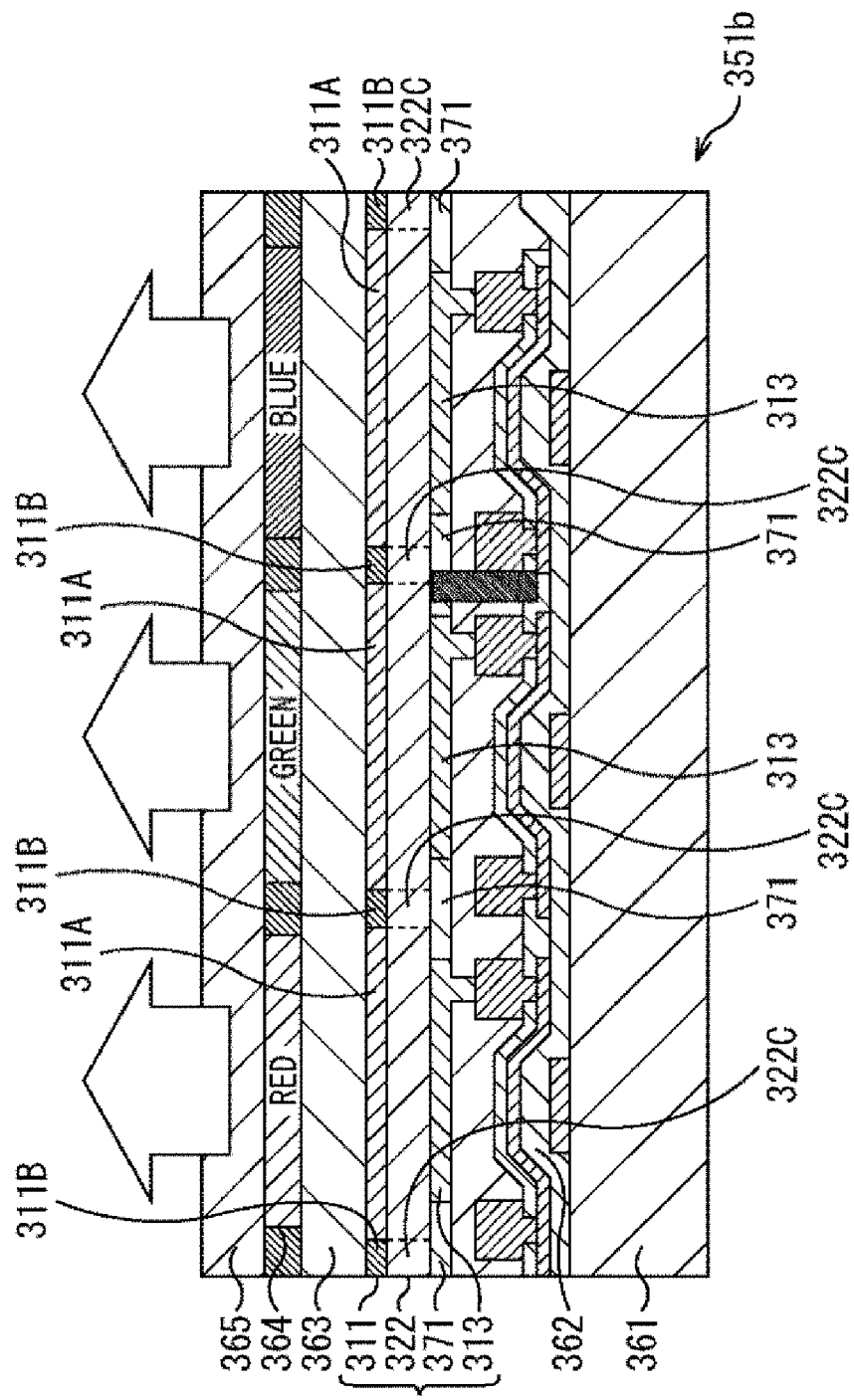
FIG. 17 is a cross-sectional diagram illustrating an example of an overall configuration of a second embodiment of the organic EL display with the organic EL unit.

FIG. 17 illustrates an example of an overall configuration of the organic EL display 351b, which is a second embodiment of the organic EL display having the organic EL unit 301 of FIG. 15. Note that the same reference numerals are given to portions corresponding to those of FIG. 16 in the drawing.

The organic EL display 351b is different from the organic EL display 351a of FIG. 16 in terms of a structure of the upper electrode film 311 and the organic EL film 322.

Specifically, high resistance regions 311B facing interlayer insulating films 371 of the upper electrode film 311 are formed in the upper electrode film 311 of the organic EL display 351b, as in the upper electrode film 117 of the solid-state imaging device 1 of FIG. 11.

In addition, an entirety of a region of the organic EL film 322 of the organic EL display 351b is substantially homogeneous, like the organic photoelectric conversion layer 116 of the solid-state imaging device 1 of FIG. 11.

In addition, movement of carriers is suppressed in suppression regions 322C surrounded by dotted lines and facing the high resistance regions 311B of the organic EL film 322 (immediately below the high resistance regions 311B). Thus, even if carriers are generated inside the suppression regions 322C, most of the generated carriers remain inside the suppression region 322C and quickly disappear. As a result, residual carriers decrease in the non-inter-electrode region and occurrence of afterimages is suppressed.

Note that the present technology can also be applied to bottom emission-type organic EL displays.

3. Third Embodiment (Usage Example of Image Sensor)

Figure 18:
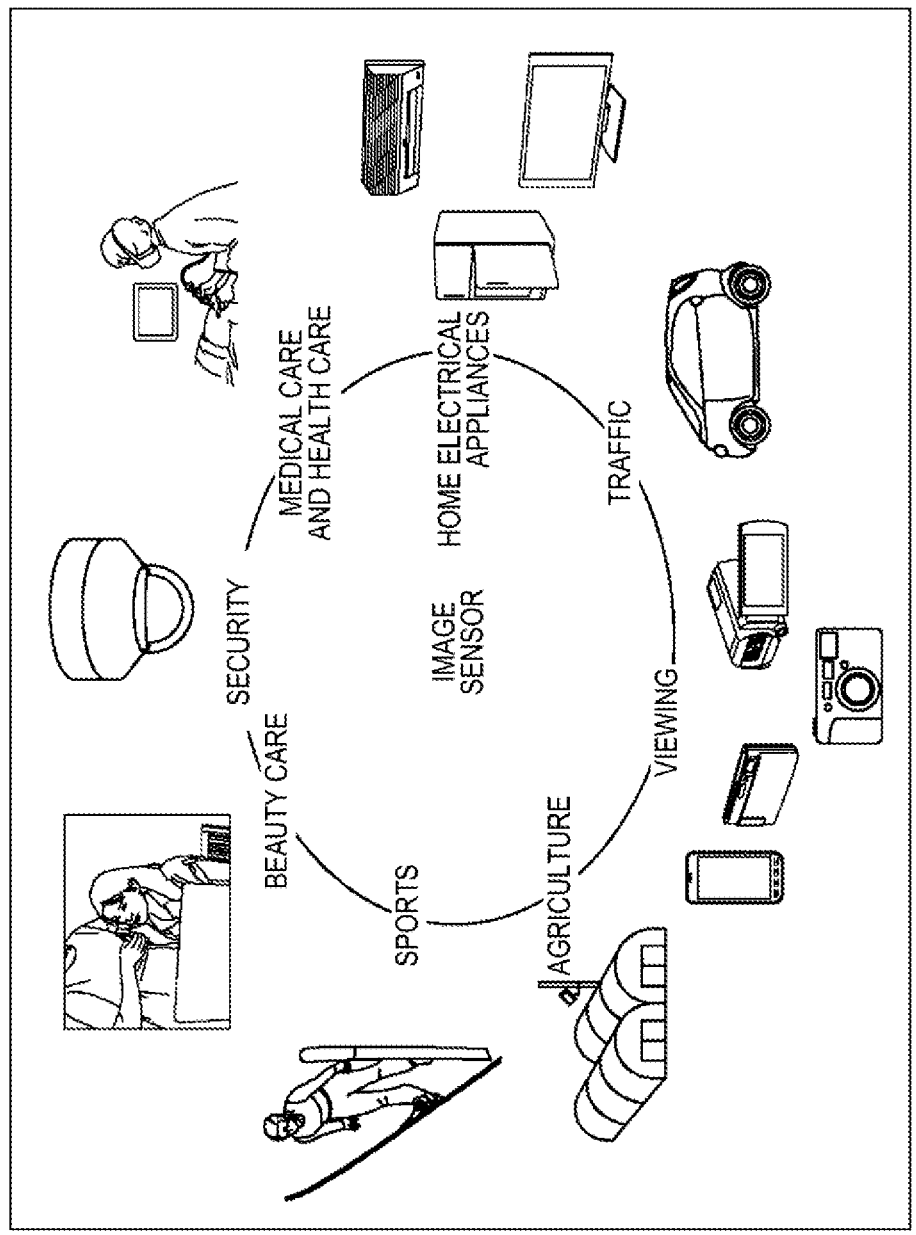
FIG. 18 is a diagram illustrating a usage example of an image sensor.

FIG. 18 is a diagram illustrating a usage example of the above-described solid-state imaging device (image sensor).

The above-described solid-state imaging device (image sensor) can be used for, for example, various cases in which light such as visible light, infrared light, ultraviolet light, or X-rays is detected as follows.

Devices that take images used for viewing, such as a digital camera and a portable appliance with a camera function.

Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.

Devices used for home electrical appliances, such as a TV, a refrigerator, and an air conditioner, to takes images of a gesture of a user and perform appliance operation in accordance with the gesture.

Devices used for medical care and health care, such as an endoscope and a device that performs angiography by reception of infrared light.

Devices used for security, such as a monitoring camera for crime prevention and a camera for personal authentication.

Devices used for beauty care, such as skin measurement equipment that takes images of the skin and a microscope that takes images of the scalp.

Devices used for sports, such as an action camera and a wearable camera for sports and the like.

Devices used for agriculture, such as a camera for monitoring the condition of the field and crops.

4. Fourth Embodiment (Example of Electronic Apparatus)

The present technology is not limited to application to the solid-state imaging device and the organic electroluminescence display, but is also applicable to an imaging apparatus. Here, the imaging apparatus is a camera system such as a digital still camera or a digital video camera or an electronic apparatus having an imaging function of a mobile phone or the like. A form with a module shape mounted on an electronic apparatus, that is, a camera module, is configured as an imaging apparatus.

Here, an example of a configuration of an electronic apparatus according to a fourth embodiment of the present technology will be described with reference to FIG. 19.

An electronic apparatus 500 illustrated in FIG. 19 includes a solid-state imaging device (element chip) 501, an optical lens 502, a shutter device 503, a drive circuit 504, and a signal processing circuit 505. As the solid-state imaging device 501, the above-described solid-state imaging device 1 according to the first embodiment of the present technology is provided. Due to the device, occurrence of afterimages in the solid-state imaging device 501 of the electronic apparatus 500 is suppressed.

The optical lens 502 enables light from a subject (incident light) to form an image on an imaging plane of the solid-state imaging device 501. Accordingly, signal charges are accumulated for a certain period of time within the solid-state imaging device 501. The shutter device 503 controls a light irradiation period and a light shielding period with respect to the solid-state imaging device 501.

The drive circuit 504 supplies a drive signal for controlling a signal transmission operation of the solid-state imaging device 501 and a shutter operation of the shutter device 503. The solid-state imaging device 501 transfers a signal (a timing signal) using the drive signal supplied from the drive circuit 504. The signal processing circuit 505 performs various kinds of signal processing on the signal output from the solid-state imaging device 501. A signal-processed video signal is stored in a storage medium such as a memory or is output to a monitor.

5. Modified Examples

Modified examples of the embodiments of the present technology will be described.

Although the example in which an organic photoelectric conversion unit is set to be one layer of the organic photoelectric conversion unit 101 in FIG. 2, the present technology can also be applied to a structure in which a plurality of organic photoelectric conversion units are vertically laminated.

In addition, although the configuration in which the present technology is applied to a CMOS solid-state imaging device has been described above, the technology can also be applied to other types of solid-state imaging devices such as a charge coupled device (CCD) solid-state imaging device.

Furthermore, although the example of the backside irradiation type has been described in the example of FIG. 2, the structure of a solid-state imaging device may employ the backside irradiation type or the surface irradiation type. In addition, the pixel structure of FIG. 2 is an example and the present technology is not limited to the pixel structure.

In addition, although the example in which the upper electrode film is shared between pixels and the lower electrode films are provide for pixels and are discontinuous has been shown, the present technology can also be applied to the case in which a lower electrode film is shared between pixels and upper electrode films are provided for pixels and are discontinuous. In addition, the present technology can also be applied to the case in which upper electrode films and lower electrode films are provided for pixels and are discontinuous.

Furthermore, in the solid-state imaging device, for example, the organic photoelectric conversion film 116 of FIG. 3, the organic photoelectric conversion film 116 of FIG. 6, or the organic photoelectric conversion film 116 of FIG. 9 and the upper electrode film 117 of FIG. 11 can be combined.

In addition, in the organic EL display, for example, the organic EL film 322 of FIG. 16 and the upper electrode film 311 of FIG. 17 can be combined.

Furthermore, the present technology can be applied to a device having a configuration in which an organic film is placed between an upper electrode film and a lower electrode film and at least one of the upper electrode film and the lower electrode film is discontinuous as well as the above-described solid-state imaging device and organic EL display.

Further, an element described as a single device (or a processing unit) above may be divided and configured as a plurality of devices (or processing units). On the contrary, elements described as a plurality of devices (or processing units) above may be configured collectively as a single device (or a processing unit). Further, an element other than those described above may be added to each device (or a processing unit). Furthermore, a part of an element of a given device (or a processing unit) may be included in an element of another device (or another processing unit) as long as the configuration or operation of the system as a whole is substantially the same. In other words, an embodiment of the disclosure is not limited to the embodiments described above, and various changes and modifications may be made without departing from the scope of the disclosure.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Additionally, the present technology may also be configured as below.

(1)

A semiconductor device including:

a first electrode;

a second electrode; and an organic film that is disposed between the first electrode and the second electrode, in which at least one of the first electrode and the second electrode is discontinuous, the organic film includes an inter-electrode region, which is a region interposed between the first electrode and the second electrode, and a non-inter-electrode region, which is a region not interposed between the first electrode and the second electrode, and the non-inter-electrode region is disposed between the adjacent inter-electrode regions, and a suppression region, which is a region in which at least one of generation and movement of a carrier is suppressed, is present within the non-inter-electrode region.

(2)

The semiconductor device according to (1), in which the suppression region has a different electrical characteristic from a surrounding region of the suppression region within the organic film.

(3)

The semiconductor device according to (2), in which the suppression region has a difference in at least one of carrier concentration, degree of movement, and band configuration from the surrounding region.

(4)

The semiconductor device according to (3), in which the suppression region has a difference in at least one of integration state, crystalline orientation, and composition from the surrounding region.

(5)

The semiconductor device according to any of (1) to (4), in which the suppression region is formed to be parallel with an end of the inter-electrode region and reaches from one surface to the other surface of the organic film.

(6)

The semiconductor device according to any of (1) to (5), in which a hollow groove is formed in the suppression region to be parallel with an end of the inter-electrode region.

(7)

The semiconductor device according to (6), in which the hollow groove passes through the organic film.

(8)

The semiconductor device according to any of (1) to (7), in which the suppression region extends from the non-inter-electrode region on at least one surface of the organic film.

(9)

The semiconductor device according to (1), in which the first electrode is continuous and the second electrode is discontinuous, and electric resistance of a high resistance region, which is all or a part of a portion of the first electrode facing a discontinuous portion of the second electrode, is higher than surroundings.

(10)

The semiconductor device according to (9), in which the high resistance region has a difference in at least one of integration state, composition, and thickness from a surrounding region of the first electrode.

(11)

The semiconductor device according to (9) or (10), in which the suppression region is present in a region facing the high resistance region in the organic film.

(12)

The semiconductor device according to any of (9) to (11), in which the first electrode is an electrode on a side on which incidence light is incident on the organic film.

(13)

The semiconductor device according to any of (1) to (12), in which the organic film is used as an organic photoelectric conversion film.

(14)

The semiconductor device according to any of (1) to (12), in which the organic film is used as an organic EL film.

(15)
A solid-state imaging device including:
a first electrode;
a second electrode; and
an organic photoelectric conversion film that is disposed between the first electrode and the second electrode,
in which at least one of the first electrode and the second electrode is discontinuous between pixels, and
a suppression region, which is a region in which at least one of generation and movement of a carrier is suppressed, is present within an inter-pixel region, which is a region between adjacent pixels within the organic photoelectric conversion film.

(16)
An electronic apparatus including:
a semiconductor device; and
a signal processing unit configured to process a signal output from the semiconductor device,
in which the semiconductor device includes,
a first electrode;
a second electrode; and
an organic film that is disposed between the first electrode and the second electrode,
at least one of the first electrode and the second electrode is discontinuous,
the organic film includes an inter-electrode region, which is a region interposed between the first electrode and the second electrode, and a non-inter-electrode region, which is a region not interposed between the first electrode and the second electrode, and the non-inter-electrode region is disposed between the adjacent inter-electrode regions, and
a suppression region, which is a region in which at least one of generation and movement of a carrier is suppressed, is present within the non-inter-electrode region.

(17)
A manufacturing method of a semiconductor device that includes a first electrode, a second electrode, and an organic film that is disposed between the first electrode and the second electrode, in which at least one of the first electrode and the second electrode is discontinuous, and the organic film includes an inter-electrode region, which is a region interposed between the first electrode and the second electrode, and a non-inter-electrode region, which is a region not interposed between the first electrode and the second electrode, and the non-inter-electrode region is disposed between adjacent inter-electrode regions,
in which a suppression region, which is a region in which at least one of generation and movement of a carrier is suppressed, is formed within the non-inter-electrode region by radiating ultraviolet light or implanting ions into the non-inter-electrode region.

(18)
A manufacturing method of a semiconductor device that includes a first electrode, a second electrode, and an organic film that is disposed between the first electrode and the second electrode, in which the first electrode is continuous and the second electrode is discontinuous, and the organic film includes an inter-electrode region, which is a region interposed between the first electrode and the second electrode, and a non-inter-electrode region, which is a region not interposed between the first electrode and the second electrode, and the non-inter-electrode region is disposed between the adjacent inter-electrode regions,
in which a high resistance region having higher electric resistance than surroundings is formed by performing plasma processing, ultraviolet light irradiation, ion implantation, or thinning on all or a part of a portion of the first electrode facing a discontinuous portion of the second electrode.

REFERENCE SIGNS LIST 1 solid-state imaging device
2 pixel
3 pixel region
11 semiconductor substrate
101, 101a to 101d organic photoelectric conversion unit
113 lower electrode film
114 interlayer insulating film
116 organic photoelectric conversion layer
116A photoelectric conversion region
116Ba to 116Bc suppression region
116C hollow groove
116D suppression region
117 upper electrode film
117A normal resistance region
117B high resistance region
301 organic EL unit
311 upper electrode film
312 organic EL layer
313 lower electrode film
322 organic EL film
322A photoelectric conversion region
322B, 322C suppression region
351 organic EL display
500 electronic apparatus
501 solid-state imaging device

The invention claimed is:
1. A semiconductor device, comprising:
a first electrode;
a second electrode; and
an organic film between the first electrode and the second electrode, wherein
at least one of the first electrode or the second electrode is discontinuous,
the organic film includes an inter-electrode region and a non-inter-electrode region,
the inter-electrode region is a region interposed between the first electrode and the second electrode,
the non-inter-electrode region is a region not interposed between the first electrode and the second electrode,
the non-inter-electrode region is between adjacent inter-electrode regions,
a suppression region, which is a region in which at least one of generation or movement of a carrier is suppressed, is present within the non-inter-electrode region, and
at least one of an integration state or a crystalline orientation of the suppression region is different from that of the organic film surrounding the suppression region.

2. The semiconductor device according to claim 1, wherein the suppression region has a different electrical characteristic from the organic film surrounding the suppression region.

3. The semiconductor device according to claim 1, wherein at least one of a carrier concentration, a degree of movement, or a band configuration of the suppression region is different from that of the organic film surrounding the suppression region.

4. The semiconductor device according to claim 1, wherein composition of the suppression region is different from that of the organic film surrounding the suppression region.

5. The semiconductor device according to claim 1, wherein the suppression region is parallel with an end of the inter-electrode region and reaches from one surface of the organic film to another surface of the organic film.

6. The semiconductor device according to claim 1, wherein a hollow groove is in the suppression region, and wherein the hollow groove is parallel with an end of the inter-electrode region.

7. The semiconductor device according to claim 6, wherein the hollow groove passes through the organic film.

8. The semiconductor device according to claim 1, wherein the suppression region extends from the non-inter-electrode region on at least one surface of the organic film.

9. The semiconductor device according to claim 1, wherein the first electrode is continuous and the second electrode is discontinuous, and
wherein an electric resistance of a high resistance region, which is all or a part of a first portion of the first electrode facing a discontinuous portion of the second electrode, is higher than that of a second portion of the first electrode surrounding the high resistance region.

10. The semiconductor device according to claim 9, wherein at least one of an integration state, a composition, or a thickness of the high resistance region is different from that of the second portion of the first electrode surrounding the high resistance region.

11. The semiconductor device according to claim 9, wherein the suppression region faces the high resistance region in the organic film.

12. The semiconductor device according to claim 9, wherein the first electrode is on a side on which incidence light is incident on the organic film.

13. The semiconductor device according to claim 1, wherein the organic film is used as an organic photoelectric conversion film.

14. The semiconductor device according to claim 1, wherein the organic film is used as an organic electroluminescence (EL) film.

15. A solid-state imaging device, comprising:
a first electrode;
a second electrode; and
an organic photoelectric conversion film between the first electrode and the second electrode, wherein
at least one of the first electrode or the second electrode is discontinuous between pixels,
a suppression region, which is a region in which at least one of generation or movement of a carrier is suppressed, is present within an inter-pixel region,
the inter-pixel region is a region between adjacent pixels within the organic photoelectric conversion film, and
at least one of an integration state or a crystalline orientation of the suppression region is different from that of the organic photoelectric conversion film surrounding the suppression region.

16. An electronic apparatus, comprising:
a semiconductor device; and
a signal processing unit configured to process a signal output from the semiconductor device,
wherein the semiconductor device includes:
a first electrode;
a second electrode; and
an organic film between the first electrode and the second electrode, wherein
at least one of the first electrode or the second electrode is discontinuous,
the organic film includes an inter-electrode region and a non-inter-electrode region,
the inter-electrode region is a region interposed between the first electrode and the second electrode,
the non-inter-electrode region is a region not interposed between the first electrode and the second electrode,
the non-inter-electrode region is between adjacent inter-electrode regions,
a suppression region, which is a region in which at least one of generation or movement of a carrier is suppressed, is present within the non-inter-electrode region, and
at least one of an integration state or a crystalline orientation of the suppression region is different from that of the organic film surrounding the suppression region.

17. A manufacturing method of a semiconductor device, comprising:
forming a suppression region by at least one of radiating ultraviolet light or implanting ions into a non-inter-electrode region of an organic film, wherein
the organic film is between a first electrode and a second electrode,
at least one of the first electrode or the second electrode is discontinuous,
the organic film includes an inter-electrode region and the non-inter-electrode region,
the inter-electrode region is a region interposed between the first electrode and the second electrode,
the non-inter-electrode region is a region not interposed between the first electrode and the second electrode,
the non-inter-electrode region is between adjacent inter-electrode regions,
at least one of generation or movement of a carrier is suppressed in the suppression region, and
at least one of an integration state or a crystalline orientation of the suppression region is different from that of the organic film surrounding the suppression region.

18. A manufacturing method of a semiconductor device, comprising:
forming a high resistance region by at least one of a plasma processing, an ultraviolet light irradiation, an ion implantation, or thinning on all or a part of a first portion of a first electrode facing a discontinuous portion of a second electrode, wherein
an electrical resistance of the high resistance region is higher than that of a second portion of the first electrode surrounding the high resistance region,
an organic film is between the first electrode and the second electrode,
the first electrode is continuous and the second electrode is discontinuous,
the organic film includes an inter-electrode region and a non-inter-electrode region,
the inter-electrode region is a region interposed between the first electrode and the second electrode,
the non-inter-electrode region is a region not interposed between the first electrode and the second electrode,
the non-inter-electrode region is between adjacent inter-electrode regions, and at least one of an integration state, a composition, or a thickness of the high resistance region is different from the second portion of the first electrode surrounding the first electrode.

19. A semiconductor device, comprising:
a first electrode, wherein the first electrode is continuous;
a second electrode, wherein the second electrode is discontinuous; and
an organic film between the first electrode and the second electrode, wherein
   the organic film includes an inter-electrode region and a non-inter-electrode region,
   the inter-electrode region is a region between the first electrode and the second electrode,
   the non-inter-electrode region is a region not between the first electrode and the second electrode,
   the non-inter-electrode region is between adjacent inter-electrode regions,
   a suppression region, which is a region in which at least one of generation or movement of a carrier is suppressed, is within the non-inter-electrode region,
   an electric resistance of a high resistance region, which is all or a part of a first portion of the first electrode that faces a discontinuous portion of the second electrode, is higher than that of a second portion of the first electrode that surrounds the high resistance region, and
   at least one of an integration state or a crystalline orientation of the suppression region is different from that of the organic film surrounding the suppression region.

* * * * *